United States Patent [19]
Gonzalez et al.

[11] Patent Number: 6,118,135
[45] Date of Patent: *Sep. 12, 2000

[54] THREE-DIMENSIONAL CONTAINER DIODE FOR USE WITH MULTI-STATE MATERIAL IN A NON-VOLATILE MEMORY CELL

[75] Inventors: Fernando Gonzalez; Raymond A. Turi; Graham R. Wolstenholme, all of Boise; Charles L. Ingalls, Meridian, all of Id.

[73] Assignee: Micron Technology, Inc., Boise, Id.

[*] Notice: This patent is subject to a terminal disclaimer.

[21] Appl. No.: 09/110,228

[22] Filed: Jul. 6, 1998

Related U.S. Application Data

[63] Continuation of application No. 08/681,278, Jul. 22, 1996, Pat. No. 5,831,276, which is a continuation-in-part of application No. 08/799,515, Feb. 12, 1997, Pat. No. 5,841,150, which is a continuation of application No. 08/483,760, Jun. 7, 1995, abandoned.

[51] Int. Cl.$^7$ .................................................. H01L 47/00
[52] U.S. Cl. .......................... 257/3; 257/4; 257/5; 257/594
[58] Field of Search ................................... 257/2, 3, 4, 5, 257/395, 396, 397, 594; 365/163

[56] References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 4,099,260 | 7/1978 | Lynes et al. | 365/105 |
| 4,115,872 | 9/1978 | Bluhm | 365/163 |
| 4,174,521 | 11/1979 | Neale | 357/45 |
| 4,194,283 | 3/1980 | Hoffmann | 29/571 |
| 4,203,123 | 5/1980 | Shanks | 357/2 |
| 4,227,297 | 10/1980 | Angerstein | 29/571 |
| 4,272,562 | 6/1981 | Wood | 427/87 |
| 4,458,260 | 7/1984 | McIntyre et al. | 357/30 |
| 4,499,557 | 2/1985 | Holmberg et al. | 365/163 |
| 4,502,208 | 3/1985 | McPherson | 29/584 |
| 4,569,698 | 2/1986 | Feist | 148/1.5 |
| 4,666,252 | 5/1987 | Yaniv et al. | 350/333 |
| 4,677,742 | 7/1987 | Johnson | 29/591 |
| 4,757,359 | 7/1988 | Chiao et al. | 357/23.5 |
| 4,795,657 | 1/1989 | Formigoni et al. | 427/96 |
| 4,804,490 | 2/1989 | Pryor et al. | 252/62.3 BT |
| 4,809,044 | 2/1989 | Pryor et al. | 357/2 |

(List continued on next page.)

FOREIGN PATENT DOCUMENTS

| | | | |
|---|---|---|---|
| 0 117 045 | 8/1984 | European Pat. Off. | H01L 45/00 |
| 60-109266 | 6/1985 | Japan | H01L 27/10 |
| 1 319 388 | 6/1973 | United Kingdom | H01L 9/00 |

OTHER PUBLICATIONS

Kim and Kim, "Effects of High–Current Pulses on Polycrystalline Silicon Diode with n–type Region Heavily Doped with Both Boron and Phosphorus," *J. Appl. Phys.*, 53(7):5359–5360, 1982.

Neale and Aseltine, "The Application of Amorphous Materials to Computer Memories," *IEEE*, 20(2):195–205, 1973.

Pein and Plummer, "Performance of the 3–D Sidewall Flash EPROM Cell," *IEEE*, 11–14, 1993.

Post and Ashburn, "Investigation of Boron Diffusion in Polysilicon and its Application to the Design of p–n–p Plysilicon Emitter Bipolar Transistors with Shallow Emitter Junctions," *IEEE*, 38(11):2442–2451, 1991.

Post et al., "Polyisilicon Emitters for Bipolar Transistors: A Review and Re–Evaluation of Theory and Experiment," *IEEE*, 39(7):1717–1731, 1992.

(List continued on next page.)

*Primary Examiner*—Minh Loan Tran
*Attorney, Agent, or Firm*—Fletcher, Yoder & Van Someren

[57] ABSTRACT

A vertically oriented diode for use in delivering current to a multi-state memory element in a memory cell. A vertical diode may be disposed in a diode container extending downwardly from a top of a silicon or oxide layer, and may be formed of a combination of silicon and/or metal layers disposed proximate to inner surfaces of a diode container. A multi-state memory element may be formed of a multi-state material, such as a chalcogenide, above a diode to complete a memory cell.

60 Claims, 14 Drawing Sheets

U.S. PATENT DOCUMENTS

| | | | |
|---|---|---|---|
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |
| 5,144,404 | 9/1992 | Iranmanesh et al. | 357/51 |
| 5,166,096 | 11/1992 | Cote et al. | 437/195 |
| 5,166,758 | 11/1992 | Ovshinsky et al. | 257/3 |
| 5,177,567 | 1/1993 | Klersy et al. | 257/4 |
| 5,296,716 | 3/1994 | Ovshinsky et al. | 257/3 |
| 5,335,219 | 8/1994 | Ovshinsky et al. | 369/288 |
| 5,341,328 | 8/1994 | Ovshinsky et al. | 365/163 |
| 5,359,205 | 10/1994 | Ovshinsky | 257/3 |
| 5,363,329 | 11/1994 | Troyan | 365/184 |
| 5,510,629 | 4/1996 | Karpovich et al. | 257/50 |
| 5,534,711 | 7/1996 | Ovshinsky et al. | 257/3 |
| 5,534,712 | 7/1996 | Ovshinsky et al. | 217/3 |
| 5,831,276 | 11/1998 | Gonzalez et al. | 257/3 |
| 5,841,150 | 11/1998 | Gonzalez et al. | 257/3 |

OTHER PUBLICATIONS

Post and Ashburn, "The Use of an Interface Anneal to Control the Base Current and Emitter Resistance of p–n–p Polysilicon Emitter Bipolar Transistors," *IEEE*, 13(8)408–410, 1992.

Rose et al., "Amorphous Silicon Analogue Memory Devices," *J. Non–Crystalline Solids*, 115:168–170,1989.

Schaber et al., "Laser Annealing Study of the Grain Size Effect in Polycrystalline Silicon Schottky Diodes," *J. Appl. Phys.*, 53(12):8827–8834, 1982.

Yamamoto et al., "The I–V Characteristics of Polycrystalline Silicon Diodes and the Energy Distribution of Traps in Grain Boudaries," *Electronics and Communications in Japan*, Part 2, 75(7):51–58, 1992.

Yeh et al., "Investigation of Thermal Coefficient for Polycrystalline Silicon Thermal Sensor Diode," *Jpn. J. Appl. Phys.*, 31(Part 1, No. 2A):151–155, 1992.

Oakley et al.,"Pillars—The Way to Two Micron Pitch Multilevel Metallisation," *IEEE*, 23–29, 1984.

Prince, "Semiconductor Memories," Memory Device and Process Technology, 118–123, 1983.

THREE-DIMENSIONAL CONTAINER DIODE FOR USE WITH MULTI-STATE MATERIAL IN A NON-VOLATILE MEMORY CELL

This application is a continuation of application Ser. No. 08/681,278, filed Jul. 22, 1996, now U.S. Pat. No. 5,831,276; which is a continuation-in-part of application Ser. No. 08/483,760, filed Jun. 7, 1995, abandoned in favor of application Ser. No. 08/799,515, filed Feb. 12, 1997, now U.S. Pat. No. 5,841,150.

BACKGROUND OF THE INVENTION

1. Field of the Invention

The disclosed method relates generally to use of multi-state materials, such as chalcogenide, in semiconductor devices and, more particularly, relates to formation of a three-dimensional container diode that may be used in conjunction with a multi-state material memory element to form an electrical memory cell.

2. Description of Related Art

Multi-state materials are materials that can be caused to change physical states in response to an input stimulus. The use of programmable variable resistance materials, such as chalcogenide, amorphous silicon, or antifuse in electronic memories is known in the art. By way of example, chalcogenides are materials that may be electrically stimulated to change states and resistivities, from an amorphous state to a crystalline state, for example, or to exhibit different resistivities while in a crystalline state. A chalcogenide material may be predictably placed in a particular resistivity state by running a current of a certain amperage through it. The resistivity state so fixed will remain unchanged unless and until a current having a different amperage within the programming range is run through the chalcogenide material. Because of these unique characteristics, chalcogenide materials may be used in memory cells for storing data in binary or higher-based digital systems.

A chalcogenide-based memory cell typically includes a chalcogenide memory element for storing data and an access element, coupled to the memory element, for use in programming and sensing the stored data. The access element may be, in one embodiment, a diode. A chalcogenide-based memory cell will typically be accessible to external circuitry by the selective application of voltages to address lines, as are conventionally used in semiconductor memories.

Because of the unique operating characteristics of chalcogenide-based memories, control of current flow is crucial to facilitate programming. Programming of chalcogenide requires large current densities. In this regard, it is desirable that a chalcogenide-based memory cell include a diode large enough to permit a large current flow in the forward direction, while allowing essentially no current flow in the reverse direction. Conventional junction diode structures large enough to supply the necessary current require so much space on the upper surface of the silicon substrate that they negate the space-saving advantages of using chalcogenide in memories. Accordingly, there is a need for a small, easily manufactured diode that can meet the performance requirements of chalcogenide-based memory cells.

SUMMARY OF THE INVENTION

This invention in one respect is a multi-state material-based memory cell having a first node and a second node, and including a diode container formed in a container layer. The diode container extends downward into the container layer and the first node is disposed in electrical communication with at least a portion of the perimeter of the container. A diode is disposed inside the container and a multi-state material memory element is electrically coupled between the diode and the second node of the memory cell.

This invention in another respect is a multi-state material-based memory matrix formed on a structure having a container layer and including a plurality of memory cells disposed between a plurality of first address lines and second address lines. Each memory cell includes a first node and a second node, with the first node being electrically connected to one of the first address lines and the second node being electrically connected to one of the second address lines. Each memory cell also includes a multi-state material memory element that is electrically coupled to the second node and a diode that is disposed in a container extending from the top surface of the container layer downward into the container layer. The diode is electrically coupled between the memory element and the first node of each memory cell.

This invention in another respect is a multi-state material-based memory cell having a first node and a second node, and including an oxide layer disposed above a substrate. A diode container extends downwardly into the oxide layer, and the first node is disposed in electrical communication with the perimeter of the container. A diode is disposed inside the container and a multi-state material memory element is electrically coupled between the diode and the second node of the memory cell.

This invention in another respect is a multi-state material-based memory matrix formed on a structure having an oxide layer disposed above a substrate and including a plurality of memory cells disposed between a plurality of first address lines and second address lines. Each memory cell includes a first node and a second node, with the first node being electrically connected to one of the first address lines and the second node being electrically connected to one of the second address lines. Each memory cell also includes a multi-state material memory element that is electrically coupled to the second node and a diode that is disposed in a container having a perimeter and extending from the top surface of the oxide layer downwardly into the oxide layer. The diode is electrically coupled between the memory element and the first node of each memory cell.

This invention in another respect is a method of making a multi-state material-based memory cell having first and second nodes on a substrate. In this method, a first node is formed on the upper surface of the substrate, an oxide layer is formed on the first node, and a diode container is formed by etching an opening into the oxide layer. The inner surface of the diode container is formed to extend from the top surface of the oxide layer downwardly into communication with the first node, and a diode is formed proximate to at least a portion of the inner surface of the container so that it is in contact with the first node. A multi-state material memory element is formed between the diode and the second node of the memory cell.

This invention in another respect is a multi-state material-based memory cell disposed on a substrate and having a first node and a second node. The memory cell includes a diode container having a side extending from the top surface of the substrate downwardly into the substrate, and a diode formed in the substrate in a region proximate to the side of the container. The diode is disposed between the first node and the side of the container, and a multi-state material memory element is electrically coupled between the diode and the second node of the memory cell.

This invention in another respect is a pair of first and second multi-state material-based memory cells disposed on a substrate, each memory cell having a first node and a second node. The pair of memory cells includes a diode container having two opposing sides extending from the top surface of the substrate downwardly into the substrate, and has first and second diodes disposed proximate to the two opposing sides of the container. A first multi-state material memory element is electrically coupled between the first diode and the second node of the first memory cell, and a second multi-state material memory element is electrically coupled between the second diode and the second node of the second memory cell.

This invention in another respect is a method of making a multi-state material-based memory cell having first and second nodes on a substrate. In this method, a diode container is formed by etching a trench into the substrate. The diode container is formed to have an inner surface extending from the top surface of the substrate downwardly into the trench in the substrate, and a diode is formed in the container proximate to at least a portion of the inner surface of the container so that the first node of the memory cell is disposed in contact with the diode. A multi-state material memory element is formed between the diode and the second node of the memory cell.

BRIEF DESCRIPTION OF THE DRAWINGS

FIG. 12(a) is a cross-sectional view of an exemplary memory element according to the embodiment shown in FIG. 12.

DETAILED DESCRIPTION OF SPECIFIC EMBODIMENTS

As used herein, the term "substrate" refers to any semiconductor substrate, such as, for example, a semiconductor wafer substrate such as silicon or GaAs. The term "substrate" may include, among other things, either a semiconductor wafer or the wafer along with various process layers formed on the wafer. The term "film" may be used interchangeably with the term "layer". The term "multi-state material" refers to any programmable variable resistance material known to the art including, but not limited to, chalcogenide, amorphous silicon, antifuse, and combinations thereof. Throughout the specification, there are polarities provided with respect to various components. It will be appreciated that polarities may be reversed without altering the basic inventive concept of the disclosed methods and memory cell embodiments.

Figure 1:
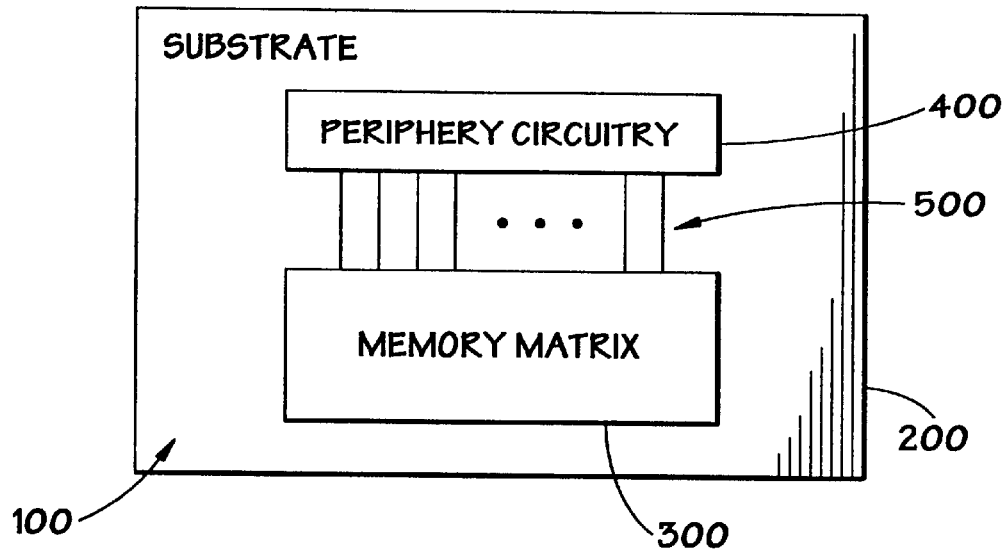
FIG. 1 is a schematic representation of an exemplary semiconductor substrate having a memory matrix formed thereon in electrical communication with periphery circuitry.
Figure 2:
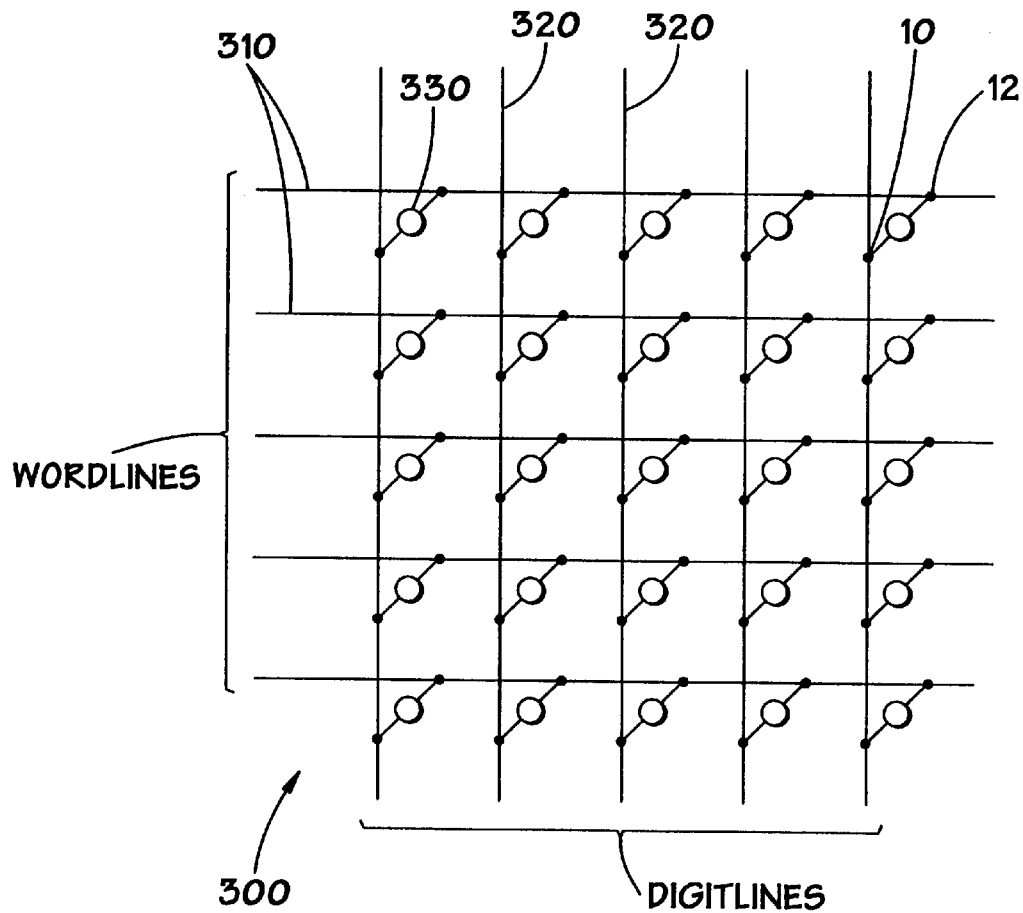
FIG. 2 is a representation of an exemplary memory matrix formed by a plurality of memory cells disposed between wordlines and digitlines according to the disclosed method.
Figure 3:
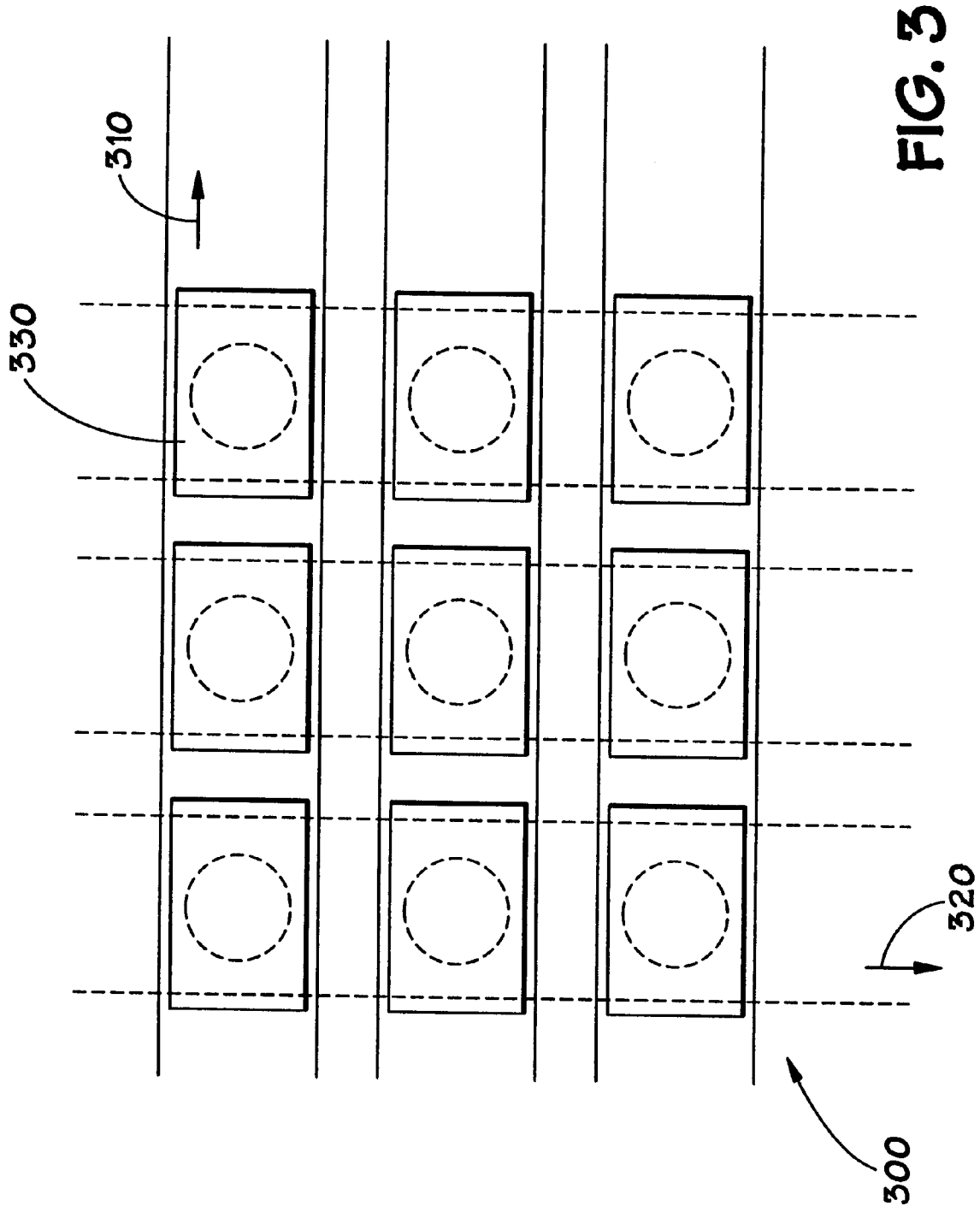
FIG. 3 is a view of an exemplary memory matrix showing the layout of a plurality of memory cells constructed in accordance with the disclosed method.

FIGS. 1–3 illustrate an exemplary semiconductor substrate and an exemplary memory matrix configuration that may be used with embodiments of the disclosed method. In addition to this configuration, a number of other suitable configurations may also be employed in the practice of the disclosed method. FIG. 1 is a schematic depiction of an exemplary electrical memory 100 in accordance with the disclosed method. Electrical memory 100 comprises semiconductor substrate 200 with memory matrix 300 and periphery circuitry 400 formed thereon. Memory matrix 300 comprises a plurality of memory cells for storing data, as described below. Periphery circuitry 400 comprises circuitry for addressing the memory elements located in memory matrix 300 and storing data therein or retrieving data therefrom. In this regard, periphery circuitry 400 may include circuitry for regulating the voltage level applied across each memory cell in order to determine which of the multiple possible resistivity levels will be programmed into that cell. Memory matrix 300 and addressing matrix 400 are in electrical communication via electrical connection 500.

FIG. 2 schematically depicts an exemplary memory matrix 300. Memory matrix 300 comprises a plurality of horizontally disposed wordlines 310 and vertically disposed digitlines 320 (collectively, "address lines"). A plurality of memory cells 330 are disposed between wordlines 310 and digitlines 320. Each memory cell 330 has a wordline node 12 and a digitline node 10 connected as shown. Wordlines 310 and digitlines 320 are electrically coupled to addressing matrix 400, so that each memory cell 330 can be uniquely addressed and accessed as needed. Wordlines 310 and digitlines 320 may be used to apply particular voltage levels to each memory cell 330 as needed for operation of memory 100. For example, the voltage differential between wordline 310 and digitline 320 corresponding to a particular cell 330 may be controlled to place the cell 330 in a program mode, a read mode, a deselect mode or a program inhibit mode. Such voltages are typically controlled by periphery circuitry 400.

FIG. 3 is a view of a memory matrix 300 comprising a plurality of memory cells 330 constructed according to the disclosed method. In FIG. 3, each memory cell 330 is disposed at the intersection of a wordline 310 and a digitline 320. Digitline 320 is shown in outline form to indicate that it is disposed beneath the surface. Also shown in outline form is a contact pore formed by a cap layer at the center of each memory cell 330.

As described above, memory cell 330 may be capable of being operated in multiple modes including a program mode, a read mode, a deselect mode, and a program inhibit mode. The operation of memory cell 330 is typically controlled by regulating the voltage differential between digitline 320 and wordline 310. In this way, current flow across a chalcogenide layer may be regulated. For example, in a program mode, the current flow resulting from a voltage differential of three volts from digitline 320 to wordline 310 may cause a chalcogenide layer to assume a high resistivity level of approximately 100 kohms, whereas current flow due to a voltage difference of two volts may cause a low resistivity level of approximately 1 kohm to be stored in a chalcogenide layer. A voltage differential of about one volt or less may be used to read or sense the cell 300 (i.e., the resistivity) without changing its state. Moreover, other voltages may be used to store data in higher base systems (greater than binary) or to operate memory cell 330 in another mode. As will be recognized, these voltages and operational characteristics are purely exemplary, and are subject to many variations and modifications. The voltage differential applied to each cell 330 is typically controlled by periphery circuitry 400. A common n-well used in such an embodiment will typically be tied to Vcc potential, as in standard CMOS circuit operation.

In some embodiments of the disclosed method, a diode container may be disposed in a container layer that may be a semiconductor substrate, one or more layers on a semiconductor substrate such as an oxide layer, or both. In one possible embodiment of the disclosed method illustrated in FIG. 4, a diode container extends downwardly from the top of a tall oxide stack into a deep trench in a single crystal silicon layer. Because the vertical diode of this embodiment is disposed in a container layer comprising both the tall oxide stack and the deep silicon trench, it is referred to as a "stack/trench" diode. In another possible embodiment of the disclosed method illustrated in FIG. 12, a diode container extends downwardly from the top of a tall oxide stack disposed on a silicon substrate. Because the vertical diode of this embodiment is disposed within a container layer comprising an opening in the oxide stack above the substrate surface, it is referred to as a "stack" diode. In another possible embodiment of the disclosed method illustrated in FIG. 18, a diode container extends downwardly from the surface of a silicon substrate into a deep trench in the silicon substrate. Because the vertical diode of this embodiment is disposed in a container layer comprising a deep silicon trench, it is referred to as a "trench" diode. In the practice of the disclosed method, a container is typically a circular or square opening, but also may be any other suitable shape, such as rectangular, triangular, oval, etc.

"Stack/trench", "stack" and "trench" embodiments have special advantages in effecting the desired operability of memory cell 330. Ovonic, or multi-state material, offers significant advantages over DRAM and Flash technology in the formulation of ultra high density non-volatile memories. However, as discussed above, it is significant to the operation of a chalcogenide-based memory cell that a large current flow be deliverable to a chalcogenide element. Need for high current drive and low reverse-bias leakage make it desirable to construct a diode structure able to drive maximum current in the smallest allowable space. In accordance with embodiments of the disclosed method, memory cell 330 may be particularly effective in this regard, in part, because of large diode surface area created by sidewalls of vertical cavities. However, embodiments of the disclosed method achieve high current throughput without requiring a great deal of space on the upper surface of memory 100. With reference to FIG. 3, each memory cell 330 is typically constructed to be approximately 0.6 microns×0.6 microns or smaller, assuming a 0.25 micron photolithography resolution. Moreover, the size of a diode and current deliverable may be easily increased by varying container depth.

In accordance with the disclosed method, memory cell 330 may also include other features designed to reduce series resistance in the memory cell, thereby increasing current flow. These features include a strapped digitline 320. A strapping layer may be a metal or other suitable type of layer disposed in contact with a digitline 320, for instance, in order to create a low-resistance current path along the interfacing surfaces of those layers. In addition to a strapping layer, other typical features may be used to reduce resistance. A thin lining, typically composed of $TiSi_2$, may be used along or proximate to the inner surface of a diode container in order to further reduce series resistance.

Stack/Trench Diode

Figure 4:
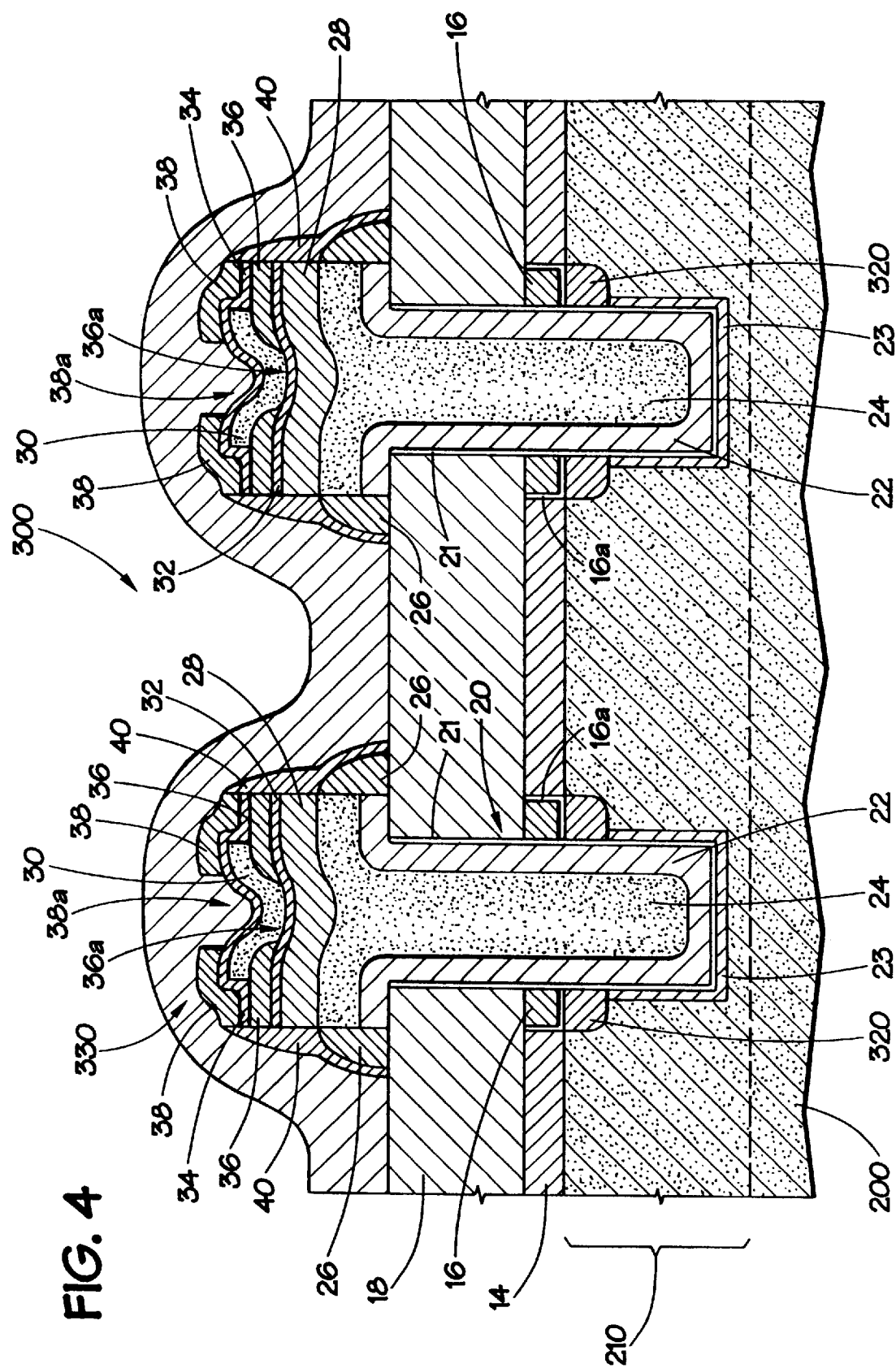
FIG. 4 is a cross-sectional view of an exemplary chalcogenide-based memory cell according to a "stack/trench" diode embodiment of the disclosed method.

FIGS. 4–11 are cross-sectional representations of an exemplary chalcogenide-based "stack/trench" diode memory cell according to the disclosed method. FIG. 4 shows a cross-section of one embodiment of memory matrix 300 including portions of two memory cells 330. Memory matrix 300 is formed on substrate 200, which is a typically a p-type substrate. In one embodiment, an N-well 210 is disposed in substrate 200. N-well 210 is typically formed from about 1 microns to about 4 microns deep in substrate 200 using conventional semiconductor fabrication techniques, for example by using a high energy implant or multiple high energy implants. However, N-well 210 is merely exemplary of the kind of silicon base that can be used to form the silicon trench. For example, a p-well could be formed in an n-type substrate. Alternatively, the base could be an epitaxial layer. In FIG. 4, A patterning layer 14 is disposed on top of N-well 210 and defines the pattern for strapping layer 16. Disposed above or proximate to patterning layer 14 is a tall oxide layer 18. Container 20 is a recess extending downwardly from the top of tall oxide layer 18 into N-well 210. Container 20 is typically about 2 microns deep.

In the embodiment illustrated in FIG. 4, memory cell 330 is disposed in and above container 20, electrically situated between digitline 320 and wordline 310. In this embodiment, all memory cells 330 in the plane of the cross-section may be tied to a single wordline 310 at their respective wordline nodes 12, as shown in FIG. 2. Likewise, all memory cells 330 in a plane perpendicular to the plan of the cross-section shown may be tied to a single digitline 320 at their respective digitline nodes 10 as shown in FIG. 2. This construction gives rise to the plurality of overlapping wordlines and digitlines depicted in FIG. 2. Strapping layer 16 is a metal layer which may be disposed on or along the surface of a digitline 320 in order to enhance conductivity by creating a low-resistance current path along interfacing surfaces of these layers. Strapping layer 16 is typically a tungsten layer disposed on and above digitline 320 over its entire length (i.e., in the direction extending into the page on FIG. 4). Strapping layer 16 is optional. Digitline 320 is typically wider than strapping layer 16 (along the cross-section shown). In addition to strapping layer 16, other features may be used to reduce resistance. A thin lining 21, typically composed of $TiSi_2$, may be used on or along the inner surface of container 20 in order to further reduce series resistance.

In FIG. 4, first silicon layer 22 and second silicon layer 24 are disposed inside container 20, and comprise a diode. First and second silicon layers 22 and 24 may be single crystal or polycrystalline silicon layers, as described below. Layers 22 and 24 are typically disposed in a concentric manner with respect to the sides or perimeter of container 20, although they may be only juxtaposed proximate to a portion of the sides or perimeter to achieve benefits from the disclosed method. Although not required, phosphorus-doped layer 23 may be disposed within N-well 210 in container 20. First and second silicon layers 22 and 24 are typically of opposite silicon types. For example, first layer 22 may be P-type and second layer 24 may be N-type. First silicon layer 22 is typically an epitaxial or single crystal layer of the same polarity as digitline 320. Second silicon layer 24 is typically polysilicon of opposite polarity. In other embodiments, a diode may have more silicon layers. Lower spacers 26 are oxide or nitride spacers that electrically isolate the patterned edges of silicon layers 22 and 24 from wordline 310. Although first and second silicon layers 22 and 24 are typically employed, a Schottky diode configuration may also be possible.

The remainder of the embodiment structure shown in FIG. 4, disposed between the top of second silicon layer 24 and wordline 310, comprises a memory element portion of memory cell 330. Layer 28 may be disposed above or proximate to second silicon layer 24. Layer 28 is typically composed of tungsten or another highly conductive material such as titanium silicide, tungsten silicide or titanium nitride. In this embodiment, chalcogenide layer 30 is sandwiched between lower electrode 32 and upper electrode 34.

Many chalcogenide alloys may be suitable for use as a memory element in connection with the disclosed method including, for example, those formed from tellurium, selenium, germanium, antimony, bismuth, lea(i strontium, arsenic, sulfur, silicon, phosphorus, oxygen, and mixtures or alloys of these elements. These alloys may be selected so as to create a material capable of assuming; multiple, generally stable, states in response to the stimulus applied. Alloys of tellurium, germanium, and antimony may be desirable, and materials having approximately 50% tellurium, approximately 20% germanium, and approximately 20% antimony, in combination with other elements such as sulfur or arsenic, may be particularly desirable. For example, one exemplary mixture may have tellurium, germanium and antimony combined in approximate proportions of 55:22:22, respectively. Other alloys, such as alloys of tellurium and germanium may also be desirable, and materials having approximately 80–85% tellurium and approximately 15% germanium, in combination with other elements such as sulfur or arsenic, may also be particularly desirable.

In the embodiment of FIG. 4, upper and lower electrodes may serve as electrical contacts for chalcogenide layer 30. Upper and lower electrodes 32 and 34 typically comprise a metal layer and a carbon layer, with the carbon layer disposed between the metal and the chalcogenide. Suitable metals include, but ire not limited to, aluminum, copper, tungsten, aluminum/copper alloy, titanium and derivatives of titanium, including titanium nitride, titanium silicide and titanium boride. In one embodiment, aluminum/copper alloy is typical. Upper and lower electrodes 32 and 34 may be formed of other materials, but typically include a layer of material selected to serve as a diffusion barrier preventing undesirable contamination of chalcogenide layer 30. However, a diffusion barrier may be omitted entirely, for example, where the layers otherwise contacting chalcogenide layer 30 present no threat of contamination and do not adversely effect series resistance within a cell. Insulative layer 36 is typically a nitride layer that serves to contour chalcogenide layer 30 so as to create a chalcogenide active area 36a in the center of memory cell 330. Cap layer 38 is typically nitride and serves to cap off memory cell 330 at the top and may define a contact opening 38a directly above or proximate to the chalcogenide active area. Cap layer 38 may be composed of various other materials effective to insulate a memory element of memory cell 330, including for example, oxide or nitride-oxide combinations. Upper and lower spacer 26 and 40 may be oxide or nitride spacers that electrically isolate the edges of the chalcogenide memory cell 330 from wordline 310. Upper and lower spacers 26 and 40 may be combined into a single spacer isolating the exposed edges of memory cell 330 from wordline 310.

Figure 5:
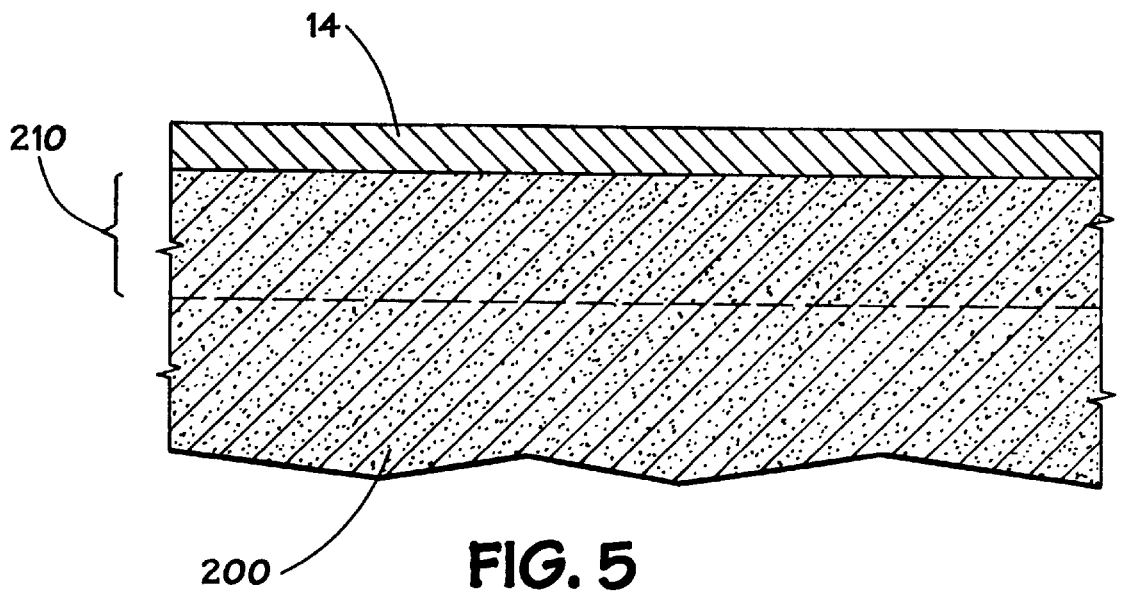
FIG. 5 is a cross-sectional view of an in-process memory cell according to the embodiment shown in FIG. 4, showing a silicon base in which a memory cell will be disposed.

One embodiment of a method for forming a "stack/trench" diode memory cell 330 as shown in FIG. 4 is now described in detail. With reference first to FIG. 5, substrate 200 may be a single crystal silicon substrate of p-type material. N-well 210 may be formed in the top of substrate 200 using, for example, conventional n-well techniques known in semiconductor processing. N-well 210 is typically from about 1 to about 4 microns deep. Patterning layer 14 may be an oxide layer disposed on top of N-well 210 by oxidation or a TEOS deposition process. Patterning layer 14 is typically 2000–3000 angstroms deep.

Figure 6:
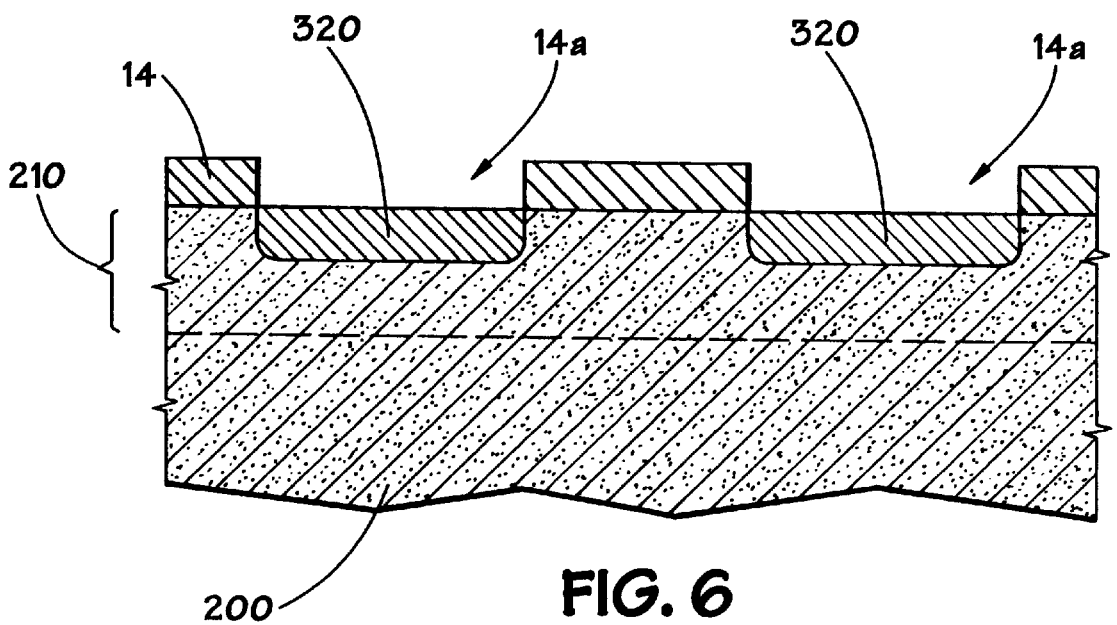
FIG. 6 is a cross-sectional view of an in-process memory cell according to the embodiment shown in FIG. 4, showing the formation of digitlines.

FIG. 6 shows how patterning layer 14 may be selectively removed by any suitable technique, including deposition of a photoresist and selective etching, to form a pattern for digitlines 320. Digitlines 320 may be long strips of P+-type silicon extending into the paper in a direction perpendicular to the cross-section shown. Digitlines 320 may be formed by standard techniques, such as diffusion or ion implantation. Digitline 320 is typically from about 0.1 to about 0.2 microns deep and may be doped to from about $10^{19}$ to about $10^{21}$ atoms/cm$^3$. The depth of digitline 320 may be optimized based on location of the diode junction, described below. Width of digitline 320 (in the cross-section shown) is typically greater than width of the gap in patterning layer 14, preventing a diode formed in container 20 from being shorted with n-well 210.

Figure 7:
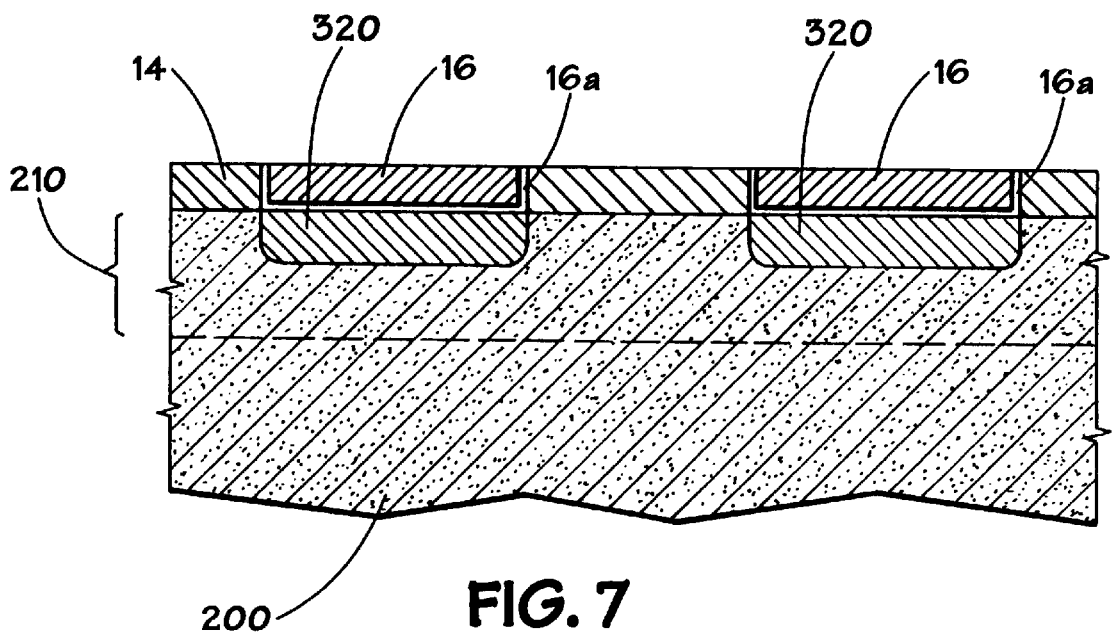
FIG. 7 is a cross-sectional view of an in-progress memory cell according to the embodiment shown in FIG. 4, showing the formation of strapping layers above digitlines.

FIG. 7 illustrates how patterning layer 14 may define a pattern for strapping layer 16. After formation of digitlines 320 in the manner described above, channels 14a formed in patterning layer 14 may be filled with strapping layer 16. In this way, strapping layer 16 may be deposited without need for an additional mask step. Strapping layer 16 may be a refractory metal intended to reduce resistance in digitline 320. It is typically tungsten or tungsten silicide deposited in channels 14a, followed by a chemical-mechanical polish or etch-back process. A titanium nitride liner 16a may be deposited before strapping layer 16. In another embodiment, strapping layer 16 may be composed of $TiSi_2$ which also performs the role of reducing resistance.

Figure 8:
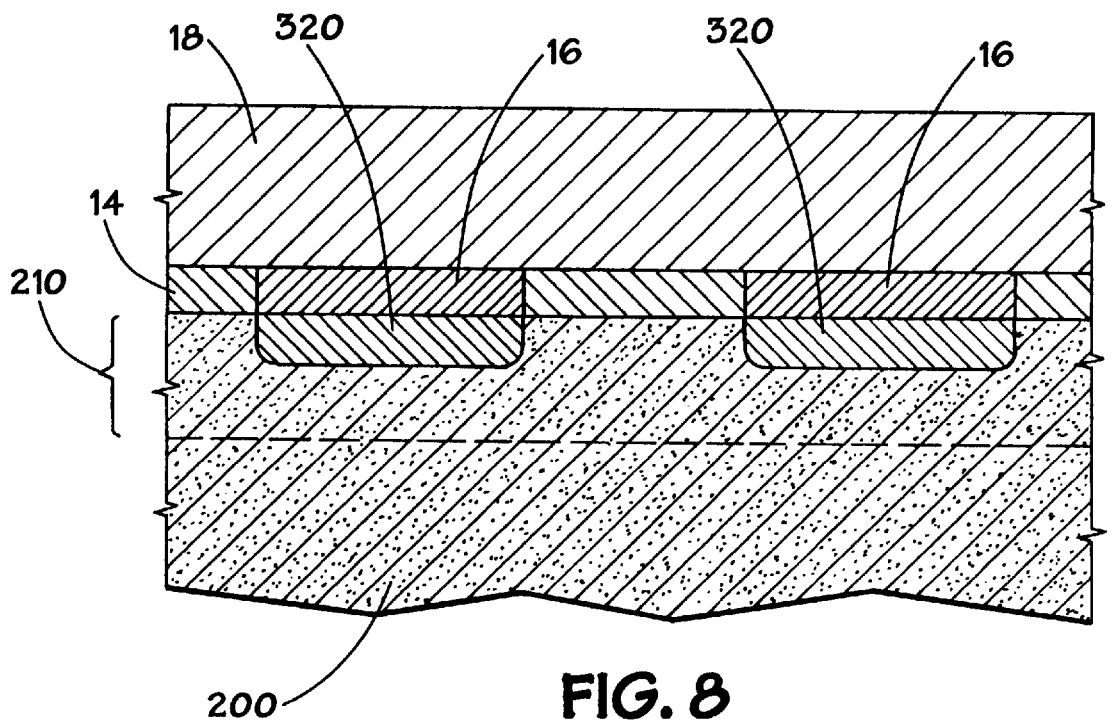
FIG. 8 is a cross-sectional view of an in-process memory cell according to the embodiment shown in FIG. 4, showing the formation of a tall oxide layer.

FIG. 8 shows tall oxide layer 18 formed on top of patterning layer 14 and strapping layer 16. Tall oxide layer 18 is typically formed using a TEOS deposition process (without doping). A TEOS deposition process is typically chosen over other methods, such as growing the oxide layer, because a TEOS process does not require an additional silicon layer to be oxidized. Tall oxide layer 18 is typically about 1 micron thick.

Figure 9:
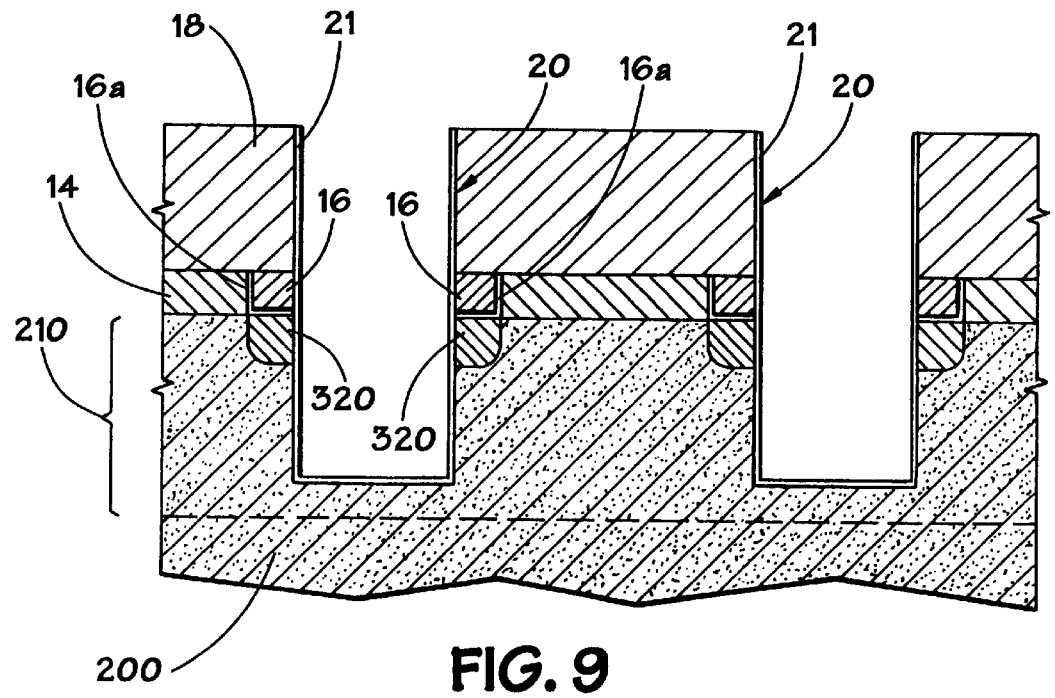
FIG. 9 is a cross-sectional view of an in-process memory cell according to the embodiment shown in FIG. 4, showing the formation of a diode container.

FIG. 9 illustrates how container 20 may be formed by selectively etching away tall oxide layer 18, tungsten strapping layer 16, digitline 320 and silicon N-well 210. Tall oxide layer 18 may be etched using a $CF_4$ dry etch. Tungsten and/or other layers can also be etched using a dry etch, such as HBr or $SF_6$. Container 20 is typically about 2 microns deep, extending from the top of tall oxide layer 18 to bottom of a trench in N-well 210. After formation of container 20, a thin lining 21 of $TiSi_2$ may be deposited to reduce resistance of the cell.

Figure 10:
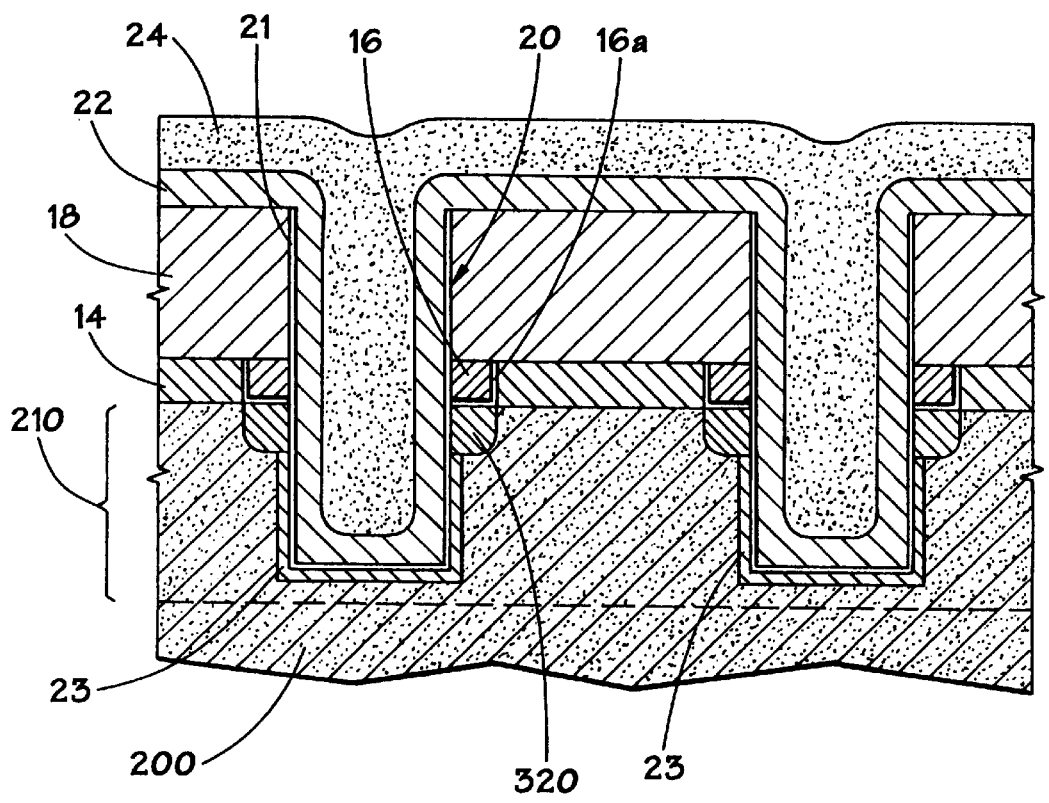
FIG. 10 is a cross-sectional view of an in-process memory cell according to the embodiment shown in FIG. 4, showing the formation of silicon layers comprising a diode.

FIG. 10 shows how a vertical diode may be formed in container 20. In this embodiment, first and second silicon layers 22 and 24 may be deposited concentrically inside container 20. First silicon layer 22 may be a P-silicon layer that is formed of polycrystalline silicon, amorphous silicon, or epitaxial silicon. Typically, first silicon layer 22 is epitaxial silicon. Second silicon layer 24 may be formed above or proximate to first silicon layer 22 and may be a N+ silicon layer that may be formed of polycrystalline silicon, amorphous silicon, or epitaxial silicon. Although not necessary, an N layer 23 may be formed in N-well 210 by doping portions of container 20 with an N-type dopant, such as phosphorus. This may create a relatively higher doped N region with respect to N-well 210. Typically, second silicon layer 24 is polycrystalline silicon and is typically insitu doped. A step to out-diffuse dopant from second silicon layer 24 into first silicon layer 22 is typically performed. This may be done, for example, by RTP at about 1000° C. for about 10 seconds. In this way, a diode junction may be moved away from a P/N interface.

Figure 11:
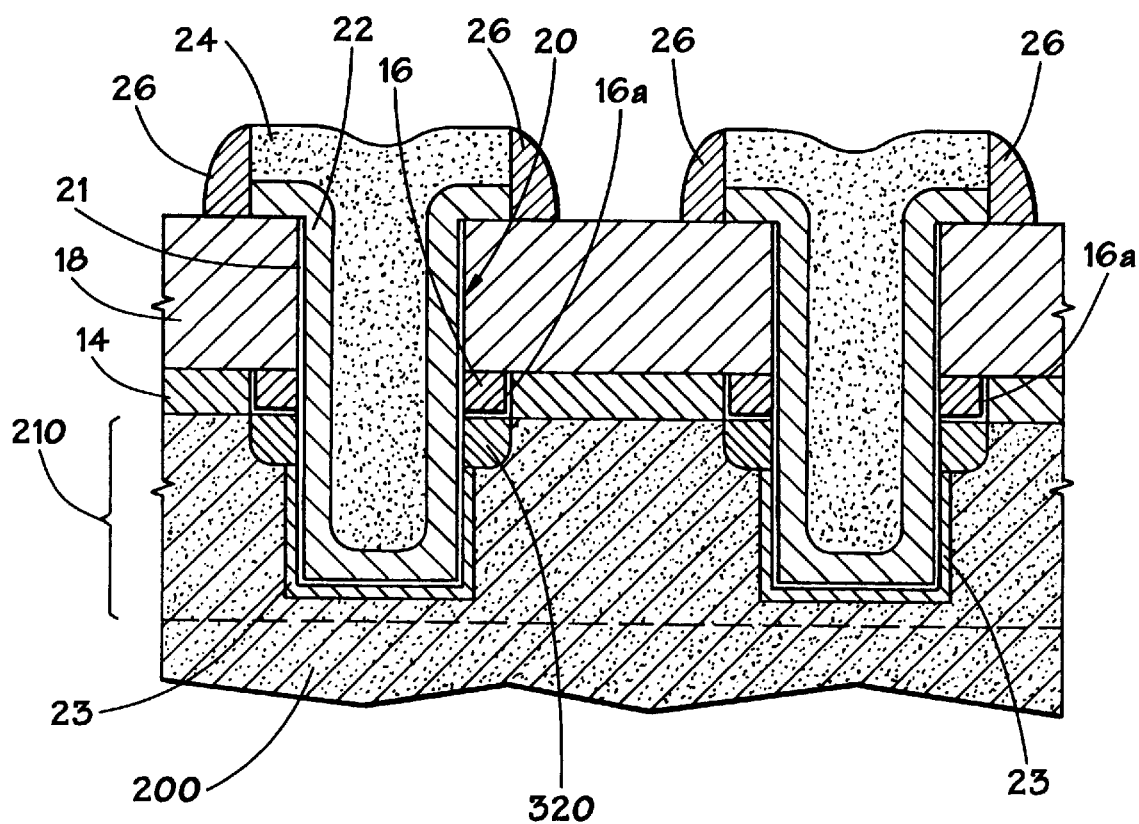
FIG. 11 is a cross-sectional view of an in-process memory cell according to the embodiment shown in FIG. 4, showing the formation of oxide spacers.

FIG. 11 illustrates a completed vertical diode formed in and above container 20. After deposition of second silicon layer 24, an oversized photoresist may be deposited on top of the diode structure, and a poly etch performed to remove excess portions of first and second silicon layer 22 and 24. Finally, lower spacers 26 may be formed by depositing and selectively etching an oxide film in a conventional manner so as to leave only lower spacers 26.

After formation of a vertical diode, the rest of memory cell 330 may be formed as follows. With reference to FIG. 4, layer 28 may be formed by depositing a tungsten layer. Lower electrode 32 is typically a dual metal-carbon layer deposited on top of layer 28. Insulative layer 36 is typically formed by depositing a nitride layer, selectively etching the nitride layer so as to define a pore at the center of memory cell 330, and stripping any remaining resist. Chalcogenide layer 30 may be deposited, in a conventional manner, so that the chalcogenide comes into contact with lower electrode 32 in a pore defined by insulative layer 36. This may define the chalcogenide active area 36a, which is typically from about 0.25 microns to about 0.5 microns across, most typically about 0.3 microns across. Upper electrode 34 may be formed by a carbon deposit on top of chalcogenide layer 30. An additional metal layer may be added to form upper electrode 34. Cap layer 38 is typically formed by depositing a nitride layer on top of upper electrode 34 and selectively etching the nitride layer to define a contact opening 38a directly above or proximate to a chalcogenide active area, so as to place upper electrode 34 in electrical communication with wordline 310. Wordline 310 may be formed by deposition and selective etching of a metal layer. As is shown in FIG. 3, wordline 310 establishes electrical communication among all memory cells 330 disposed in the same horizontal row.

Stack Diode

Figure 12:
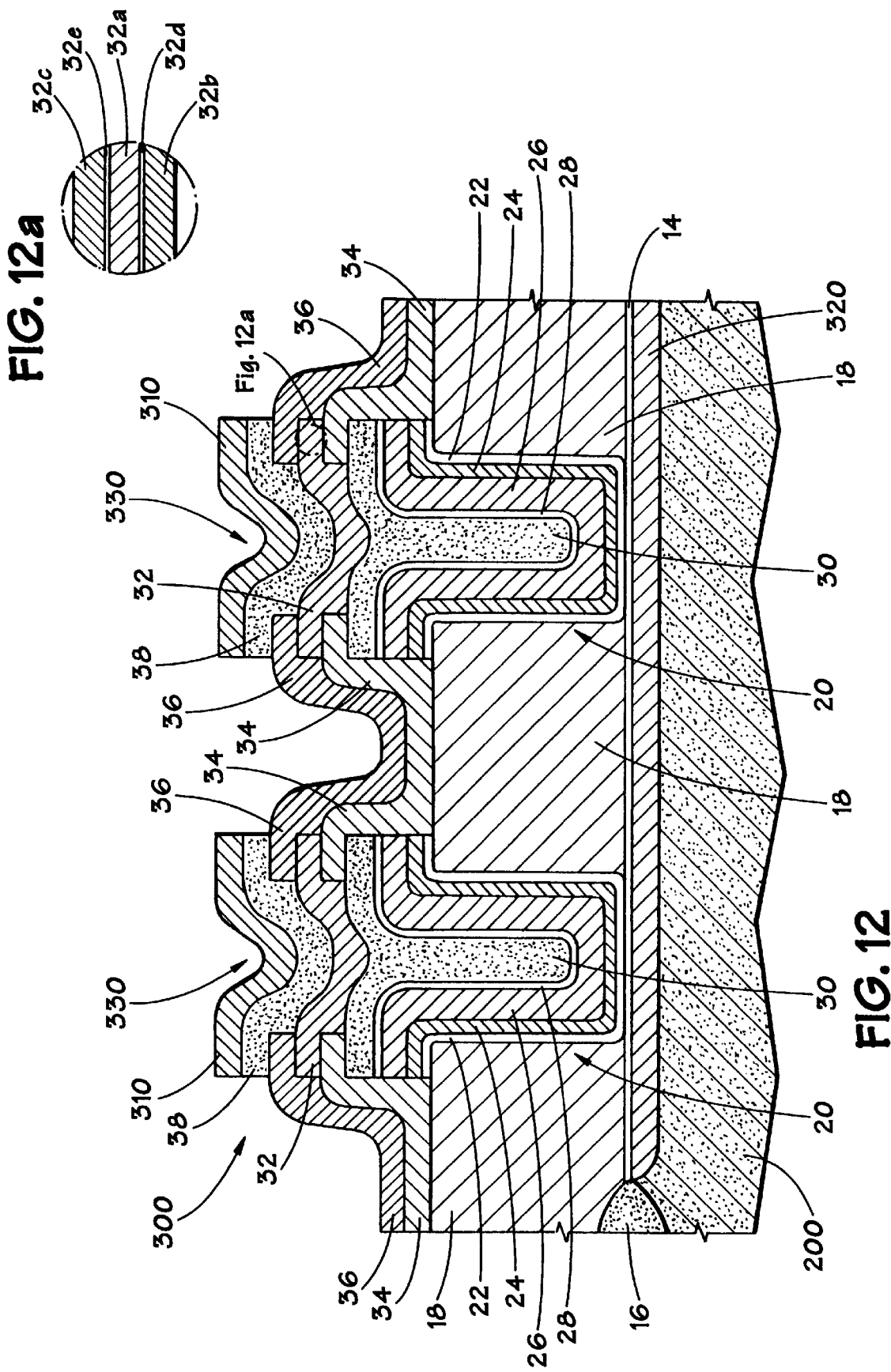
FIG. 12 is a cross-sectional view of an exemplary chalcogenide-based memory cell according to a "stack" diode embodiment of the disclosed method.

FIGS. 12–17 are cross-sectional representations of an exemplary chalcogenide-based "stack" diode memory cell according to the disclosed method which offers the advantage of simple processing. FIG. 12 shows a cross-section of memory matrix 300 including portions of two memory cells. Memory matrix 300 may be formed on substrate 200, which is typically a p-type substrate. Digitline 320 may be disposed along or proximate to the upper surface of substrate 200, and typically comprises N+ silicon material. In this embodiment, a thin layer 14, typically of $TiSi_2$, is deposited on or above digitline 320 to enhance conductivity by digitline 320. Field oxide 16, typically $SiO_2$, may be selectively formed above or proximate to substrate 200 in order to isolate different active regions of substrate 200. Oxide base 18, in which each memory cell 330 may be formed, is disposed above or proximate to digitline 320. Oxide base 18 is typically an oxide layer, such as silicon oxide formed by TEOS deposition. As an alternative, substrate 200 may also serve as a base for formation of memory cell 330. For example, the embodiment of the disclosed method shown in FIG. 4 is formed directly into a silicon substrate. In such an embodiment, digitline 320 may come into contact with sides of container 20, rather than its bottom.

In the embodiment illustrated in FIG. 12, memory cell 330 is physically and electrically situated between digitline 320 and wordline 310. In this embodiment, all memory cells 330 in the plane of the cross-section may be tied to a single digitline 320 at their respective digitline nodes 10, as shown in FIG. 2. Likewise, all memory cells 330 in a plane perpendicular to the plane of the cross-section shown may be tied to a single wordline 310 at their respective wordline nodes 12. This construction gives rise to a plurality of overlapping wordlines and digitlines as depicted in FIG. 2.

In accordance with the embodiment of the disclosed method illustrated in FIG. 12, each memory cell 330 is formed in and above a container 20. Container 20 may be an opening, typically cylindrical, extending downwardly from top of oxide base 18 to digitline 320. Container 20 may also be of any other suitable shape, such as square, rectangular, triangular, oval, etc. Disposed inside container 20, along or proximate to its inner surface, may be a thin layer 22 of sacrificial polysilicon which may be doped with phosphorus. Immediately inside layer 22 may be a thin layer 24 of a material that reduces resistance, such as $TiSi_2$. In this embodiment, operative diode layers may comprise first diode layer 26 and second diode layer 28. Layers 22 and 24 are typically disposed in concentric manner with respect to the sides or perimeter of container 20, although they may be only juxtaposed proximate to a portion of the sides or perimeter to achieve benefits from the disclosed method.

Still referring to FIG. 12, first diode layer 26 is typically a conformal layer of N-amorphous silicon material that is lightly doped to lower reverse bias leakage. First diode layer 26 is typically lightly doped to about $10^{16}$ atoms/cc to lower reverse bias leakage; with layer 24 serving to lower series resistance. Second diode layer 28 may be a metal layer, such as a $PtSi_x$ layer, deposited to form a Schottky diode (together with first diode layer 26). Alternatively, second diode layer 28 may be a P+ silicon layer, typically created by a P+ angle implant performed on upper surface of first diode layer 26. Depending on the embodiment selected, depths of first and second diode layers 26 and 28 will vary. As shown in FIG. 12, layers 22, 24, 26, 28 and 30 may be disposed to form a diode on an upper surface of oxide layer 18 as well as within container 20. Plug layer 30 may be disposed on top of second diode layer 28. In this embodiment, plug layer 30 is electrically conductive so as to allow communication between diode and memory element portions of memory cell 330. Plug layer 30 is typically a conformal TiW or a W layer. In this embodiment, plug layer 30 may form the last layer of a diode portion of a memory cell. However, in the practice of this method a diode may have more or fewer layers than does the embodiment shown and described here.

In the "stack" diode embodiment of FIG. 12, memory element 32 may be disposed above or proximate to plug layer 30. As shown in FIG. 12(a), memory element 32 may comprise a chalcogenide layer 32a sandwiched between lower electrode 32b and upper electrode 32c. Many chalcogenide compositions are suitable for use in chalcogenide layer 32a, including those listed above in connection with the "stack/trench" diode embodiment shown in FIG. 4, such as a 55:22:22 alloy of tellurium, germanium and antimony. In the "stack" diode embodiment of FIG. 12, alloys of tellurium and germanium may also be desirable, and materials having approximately 80–85% tellurium and approximately 15% germanium, in combination with other elements such as sulfur or arsenic, may be particularly desirable.

In the embodiment of FIG. 12, upper and lower electrodes 32b and 32c may serve as electrical contacts for chalcogenide layer 32a. Electrodes 32b and 32c typically comprise metal layers with carbon layers 32d and 32e typically disposed between electrodes and chalcogenide layer 32a. Suitable metal layers for electrodes 32b and 32c include, but are not limited to, aluminum, copper, tungsten, aluminum/copper alloy, titanium and derivatives of titanium, including titanium nitride, titanium silicide and titanium boride. In one embodiment, aluminum/copper alloy is typical. Electrodes 32b and 32c may be formed of other materials, but will typically have a layer of material, such as carbon, to serve as a diffusion barrier to prevent undesirable contamination of chalcogenide layer 32a. Such a diffusion barrier may be omitted entirely, for example, where layers otherwise contacting chalcogenide layer 32a present no threat of contamination and do not adversely effect series resistance within a cell.

In this embodiment, insulative layer 34 is typically a nitride layer that serves to contour memory element 32 in order to form a pore or opening near the center of memory cell 330 through which contact to memory element 32 may be made. Through this pore memory element 32 typically comes into electrical communication with plug layer 30, thereby creating a chalcogenide active area. Insulative layer 34 also may serve to electrically isolate the diode portion of memory cell 330 from neighboring features disposed on memory matrix 300. Insulative layer 34 may be composed of various other materials, including for example, oxides or other insulating materials.

In the embodiment of FIG. 12, cap layer 36 is typically a nitride layer that may serve to contour contact layer 38 to form a contact opening near the center of memory cell 330 through which contact to memory element 32 may be made. Cap layer 36 may be composed of various other materials effective to insulate the memory element of memory cell 330, including for example, oxides, nitrides, nitride-oxide combinations or other insulators. Finally, wordline 310 may be disposed above or proximate to contact layer 38 so that memory cell 330 is electrically coupled between wordline 310 and digitline 320, as shown in FIG. 2. Contact layer 38 is typically TiW, but may also be comprised of any other suitable conductor known to the art, including other metals, metal based alloys and conductive oxides. Wordline 310 may be a long metal line disposed perpendicularly to digitline 320, in a direction running into the paper. Wordline 310 is typically aluminum or an aluminum based metal, but may also be any other suitable conductor known to the art, including metals, metal based alloys, conductive oxides or mixtures thereof. Wordline 310 may also be formed to directly contact memory element 32 without use of contact layer 38.

In addition, memory cell 330 may include feature designed to reduce series resistance, thereby increasing current flow. These features may include layers 14 and 24, which may serve to reduce resistance experienced during operation of memory matrix 300 by strapping digitline 320 and inner surface of container 20, respectively. Both layers 14 and 24 are typically comprised of $TiSi_2$, but other highly conductive materials may also be useful in this regard.

Figure 13:
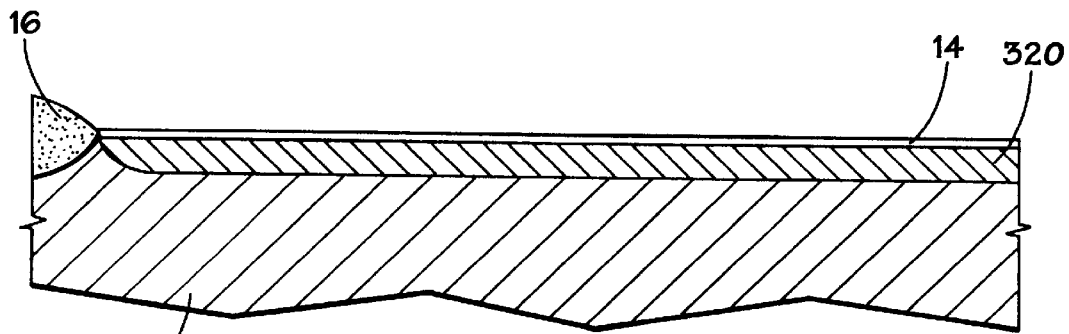
FIG. 13 is a cross-sectional view of an in-process memory cell according to the embodiment shown in FIG. 12, showing formation of a digitline on a substrate surface.

One embodiment of a method for forming a "stack" diode memory cell 330 as shown in FIG. 12 is now described in detail. With reference first to FIG. 13, substrate 200 is typically a single crystal silicon substrate of P type material. Digitline 320 is typically a long line of N+ material running along or proximate to the upper surface of substrate 200. Digitline 320 may be formed using any suitable method known to the art, including, for example, deposition of oxide, patterning of the oxide to form the digitline, removal of oxide to expose the digitline patterned substrate, and implanting N+ material into substrate 200. Digitline 320 is typically formed about 1 micron deep in substrate 200. Once digitline 320 is formed, a layer 14 may be deposited to "strap" digitline 320 to improve its conductivity. Any conductor suitable for reducing resistance may be employed, including refractory metals such as tungsten and tungsten silicide. However, layer 14 is typically $TiSi_2$. Field oxide 16 may be formed by conventional methods such as, for example, LOCOS.

Figure 14:
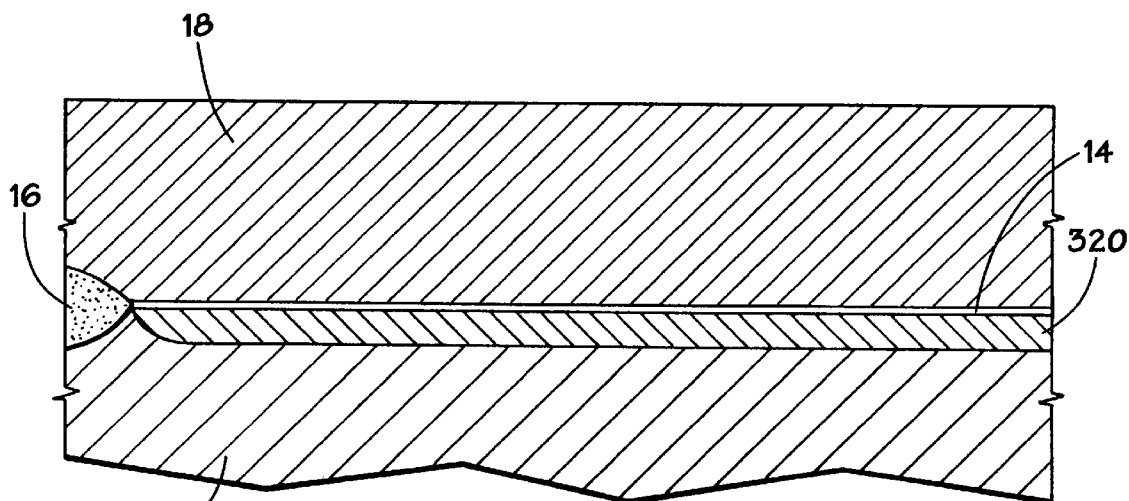
FIG. 14 is a cross-sectional view of an in-process memory cell according to the embodiment shown in FIG. 12, showing formation of an oxide base.

FIG. 14 shows oxide base 18. Once digitline 320 has been disposed on upper surface of substrate 200, oxide base 18 is formed. Oxide base 18 is typically an oxide layer formed using a TEOS deposition process (without doping). Oxide base 18 may be formed using any suitable method known to the art. However, a TEOS deposition process is typically chosen over other methods, such as growing the oxide layer, because a TEOS process provides its own source of silicon and therefore does not deplete silicon from the surface of the device being formed. Oxide base 18 is typically from about 1 micron to about 2 microns deep. Depth of oxide base 18 may be changed to alter the height of a diode formed therein, thereby changing deliverable current across memory element 32.

Figure 15:
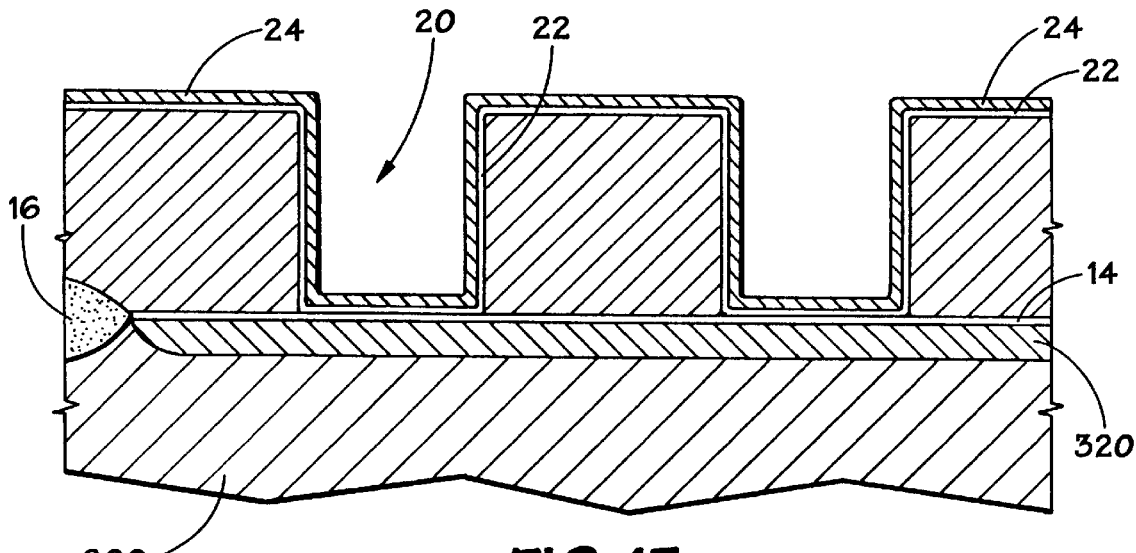
FIG. 15 is a cross-sectional view of an in-process memory cell according to the embodiment shown in FIG. 12, showing formation of container holes within an oxide base.

Referring to FIG. 15, container 20 may be formed by patterning and selectively etching away oxide base 18. Etching may be accomplished using any suitable etching means known to the art, such as $CF_4$ dry etch or other oxide plasma etching chemistries. In the embodiment shown in FIG. 15, container 20 is typically from about 0.5 microns to about 1.5 microns deep, extending down to digitline 320, so that diode layers deposited within container 20 will be in electrical communication with digitline 320. After formation of container 20, a layer 22, typically of sacrificial polysilicon that is between about 100 angstroms and about 500 angstroms thick, may be deposited along or proximate to inner surface of container 20. Layer 22 is most typically deposited to be about 300 angstroms thick. A thin lining 24 of $TiSi_2$ may be deposited to reduce resistance experienced by the diode, being typically from about 100 angstroms to about 500 angstroms thick, most typically about 300 angstroms thick. Lining 24 is especially useful to reduce high resistance on the N– side of the diode formed in container 20.

Figure 16:
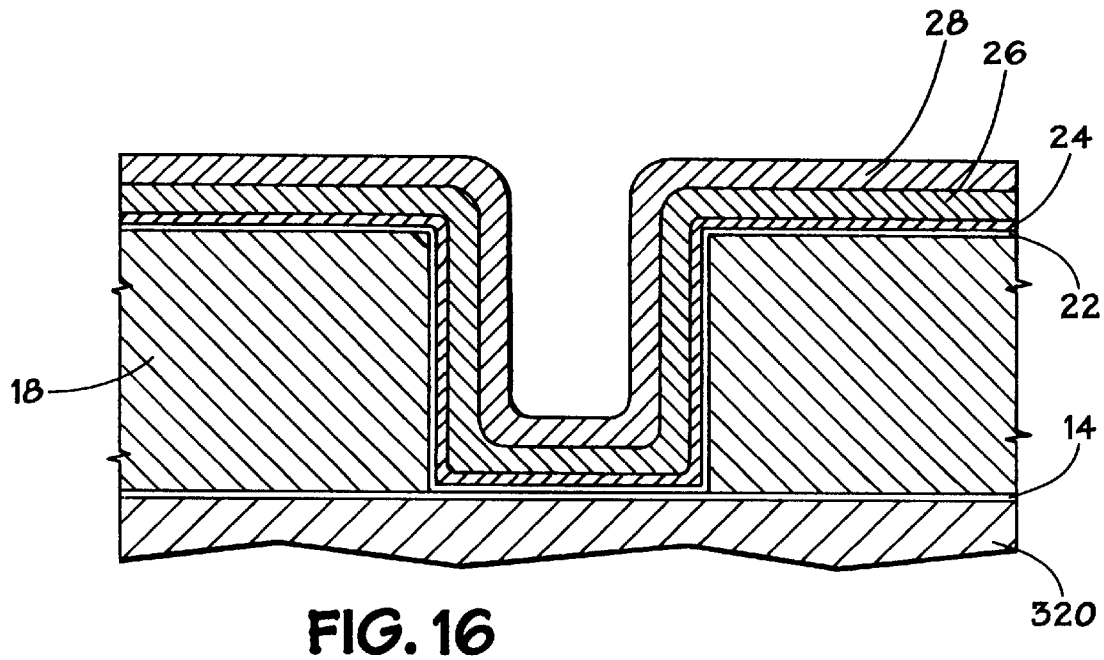
FIG. 16 is a cross-sectional view of an in-process memory cell according to the embodiment shown in FIG. 12, showing formation of diode layers within a container hole.

FIG. 16 illustrates diode layers formed concentrically in container 20. Layers 22 and 24 are typically disposed around or proximate to the sides or perimeter of container 20, although they may be only juxtaposed proximate to a portion of the sides or perimeter to achieve benefits from the disclosed method. First diode layer 26 may be formed of polycrystalline silicon, amorphous silicon or epitaxial silicon. However, due to temperature sensitivity of $TiSi_2$ lining 24 which may be used in this embodiment, epitaxy temperatures greater than about 900° C. should be avoided when this lining is present. Therefore, first diode layer 26 is typically a conformal layer of N-amorphous silicon that may be lightly doped to lower reverse bias leakage. First diode layer 26 is typically deposited to a thickness of between about 700 angstroms to about 1300 angstroms, most typically about 1000 angstroms. However, first diode layer 26 may be required to be thicker in those embodiments where second diode layer 28 is formed from first diode layer 26. First diode layer 26 is typically doped to a concentration of from about $5 \times 10^{16}$ atoms/cm$^3$ to about $1 \times 10^{17}$ atoms/cm$^3$ using phosphorus as a dopant. In the embodiment of FIG. 16, second diode layer 28 may be formed above or proximate to first diode layer 26 and typically is formed to have a thickness of from about 100 angstroms to about 500 angstroms, most typically about 300 angstroms. Second diode layer 28 may be formed from the upper portion of first diode layer 26 by doping. For example, second diode layer 28 may be a P+ silicon layer formed by implanting P+ material into the upper surface of first diode layer 26 using angular implantation techniques, followed by a rapid thermal processing (RTP) annealing step at about 900° C. for about 10 seconds. Alternatively, second diode layer 28 may be formed by depositing a platinum silicide ($PtSi_2$) layer, followed by an annealing step at about 600° C. for about 10 seconds to create a Schottky diode at the metal-silicon junction.

Figure 17:
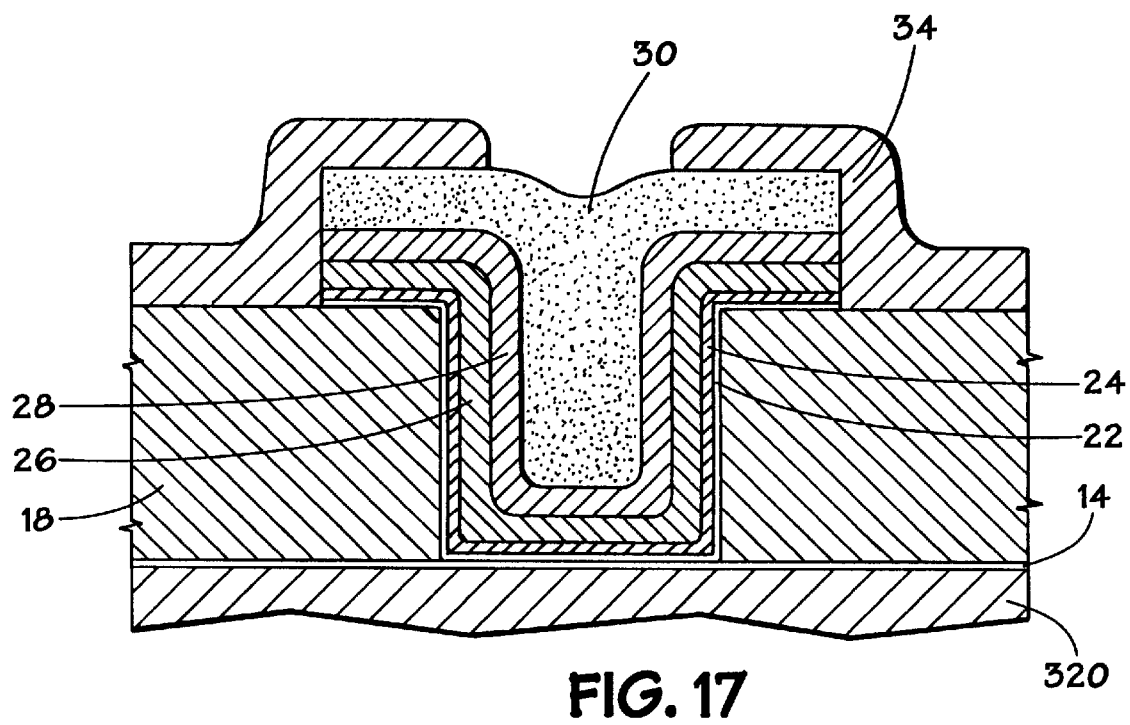
FIG. 17 is a cross-sectional view of an in-process memory cell according to the embodiment shown in FIG. 12, showing formation of a completed diode.

FIG. 17 illustrates a completed diode formed in and above container 20. In FIG. 17, plug 30 may be formed by depositing a conformal layer of TiW, Ti or some other suitable highly conductive material above or proximate to second diode layer 28. Plug 30 is typically deposited to have a thickness of from about 700 to about 1300 angstroms, most typically about 1000 angstroms. All deposited layers may be tailored using mask and etch steps to define a plurality of discrete memory cells 330 across matrix 300. This may be accomplished using an oversized photoresist pattern deposited on top of the diode structure, followed by a poly etch to remove excess portions of layers 22, 24, 26, 28, and 30. Insulative layer 34 is formed typically by deposition and selective etching of a nitride layer to define an opening near the center of memory cell 330 through which memory element 32 may come into contact with plug 30.

FIG. 12 illustrates one embodiment a completed memory cell 330, including memory element 32 and accompanying insulating layers formed on top of a diode structure. Memory element portions of this embodiment nay be formed in manners and with materials similar to those described for the other embodiments. For example, memory element 32 may be formed typically by deposition of successive layers of metal, carbon, chalcogenide, carbon, and metal, so as to define lower electrode 32b, chalcogenide layer 32a, and upper electrode 32c, respectively. Lower electrode 32b is typically a dual metal-carbon layer deposited on top of plug layer 30 and insulative layer 34 so that it comes into contact with plug layer 30. Chalcogenide layer 32a may be deposited in a conventional or other manner known to the art so that chalcogenide material comes into contact with lower electrode 32b. Upper electrode 32c is typically a dual metal-carbon layer deposited on top of and in contact with chalcogenide layer 32a. A selective etching process (including mask and etch) may be performed to tailor memory element 32 to about the same size as underlying diode structures. Chalcogenide active area may thus be defined by the area of electrode-chalcogenide contact and is typically from about 0.25 microns to about 0.5 microns across, most typically about 0.3 microns across. Alternatively, an insulative layer and cap layer may be used to define a chalcogenide active area such as, for example, layers 238 and 240 in the embodiment of FIG. 18. Cap layer 36 is formed, typically by depositing a nitride layer on top of upper electrode 32c and selectively etching the nitride layer to define a contact opening directly above or proximate to the chalcogenide active area, so as to place upper electrode 32c in electrical communication with contact 38.

Still referring to FIG. 12, contact layer 38, typically a layer of TiW or another highly conductive material, may optionally be deposited between wordline 310 and memory element 32. If contact layer 38 is disposed above cap layer 36 (as shown in FIG. 12), a separate selective etch step may be performed to tailor contact layer 38 to the size of memory cell 330. Alternatively, another nitride layer may be used to isolate contact layer 38 and selectively etched to define a contact opening. Finally, wordline 310 is formed so that it is in electrical contact with contact layer 38 or alternatively, with upper conductor layer 32c. In the practice of the disclosed method, wordline 310 may be formed by deposition and selective etching of a metal layer or other suitable conducting material know to the art. As shown in the embodiment of FIG. 3, wordline 310 may be oriented to establish electrical communication among all memory cells 330 disposed in the same horizontal row.

Trench Diode

Figure 18:
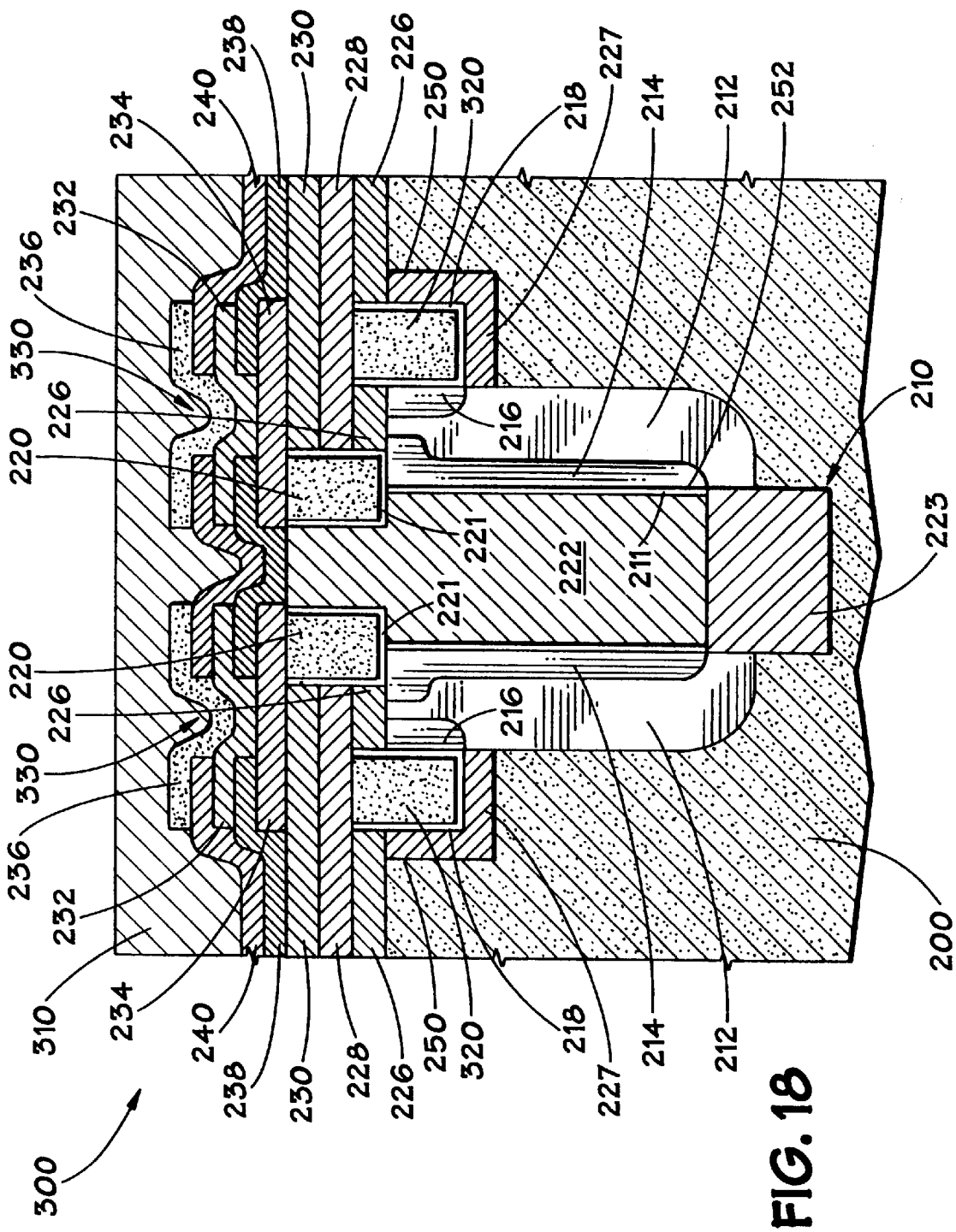
FIG. 18 is a cross-sectional view of two exemplary chalcogenide-based memory cells according to a "trench" diode embodiment of the disclosed method.

FIGS. 18–23 are cross-sectional representations of an exemplary chalcogenide-based "trench" diode memory cell according to the disclosed method. FIG. 18 shows a cross-section of memory matrix 300 including two memory cells 330. In this embodiment, memory matrix 300 may be formed on substrate 200, which is typically a P type silicon substrate. Container 210 may be formed in substrate 200. Container 210 is typically from about 3 microns to about 10 microns deep. However, it will be recognized that the depth of container 210 may be altered to create more or less diode surface area, as needed for a particular device being constructed. Container 210 typically has a container liner layer 211 deposited along or proximate to its inner surface in a region that will be used to form diodes. Container liner layer 211 is typically $TiSi_2$, but it may be any material effective to strap the diode layers and reduce resistance.

In the embodiment illustrated in FIG. 18, memory cell 330 may be disposed in and above container 210, electrically situated between digitline 320 and wordline 310. In this embodiment, all memory cells 330 in the plane of the cross-section shown may be tied together to a common wordline 310, as shown in FIG. 2. Likewise, all memory cells 330 in a plane perpendicular to the cross-section shown may be tied to a single digitline 320, as shown in FIG. 2. Digitline 320 may run in a direction extending into the paper and is typically tungsten. Advantageously, tungsten is a lower resistivity material which does not current limit a programming circuit. However, any other suitable conducting material known to the art may be used. Digitline 320 may also have a digitline liner layer 218, typically of $TiSi_2$, effective to reduce resistance. When highly conductive metals or other materials are used for wordline 310 and digitline 320, this embodiment advantageously provides enhanced speed and reliability. This embodiment also may be configured to offer the additional advantage of flat topography. Further, CMOS circuitry may be easily integrated in the periphery by doing CMOS processing first.

According to the embodiment illustrated in FIG. 18, each container 210 may hold two diodes formed between digitline 320 and diode contact 220. Each diode typically comprises a first diode layer 212 and a second diode layer 214. Layers 22 and 24 are typically disposed on opposing sides of container 20, and may be only disposed on a portion of the sides to achieve benefits from the disclosed method. In this embodiment, first diode layer 212 is typically an N− type layer of silicon formed by ion implantation of inner surface of container 210. A layer 216, typically of N+ material, may be disposed between first diode layer 212 and buried digitline 320 to promote a good electrical contact. Contact between digitline 320 and a diode may be made along the sidewall of the digitline trench, thereby increasing cell compaction. Second diode layer 214 is typically a P+ type layer of silicon formed on or along outer surface of first diode layer 212 (along or proximate to inner surface of container 210 by a second ion implantation step. Alternatively, second diode layer 214 may be a deposited metal layer, such as $PtSi_x$, effective to create a Schottky diode. Diode contact 220, which is typically a tungsten region, may be disposed in communication with second diode layer 214. Contact liner 221, which is typically $TiSi_2$, may be used to promote conductivity.

In the embodiment illustrated in FIG. 18, container 210 is typically filled with oxide filler layers 222 and 223 effective to isolate two adjacent memory cells 330 that share a common container 210. In addition, oxide layers 226, 227, 228, and 230 are typical features effective mutually to isolate various active regions of memory cell 330. For example, layer 227 may isolate digitline 320 from substrate 200, and layer 226 may isolate digitline 320 from diode contact 220. However, while electrical isolation of various active regions of memory cell 330 from other regions may be required or desired for some embodiments of the disclosed method, particular disposition and composition of these layers is not necessarily considered critical.

The remainder of the memory cell embodiment 330 shown in FIG. 18, disposed generally above oxide layer 230, is typically a memory element portion of memory cell 330. Typically, memory element 330 is disposed above digitline 320 and vertical diode layers 212 and 214 to achieve maximum compaction. When this feature is combined with a tungsten digitline connected to a sidewall of a diode comprising relatively thin vertical diode layers, a structure very close to about 6 F squared may be achieved. Chalcogenide layer 232 may be disposed between lower electrode 234 and upper electrode 236. Many chalcogenide compositions are suitable for use in chalcogenide layer 232, including those listed above in connection with the "stack/trench" and "stack" diode embodiments shown in FIG. 4 and FIG. 12. Lower electrode 234 typically comprises a metal layer and a carbon layer (with carbon disposed on the chalcogenide side of lower electrode 234) that makes electrical contact between diode contact 220 and chalcogenide layer 232. Likewise, upper electrode 236 typically comprises a metal layer and carbon layer (also with the carbon disposed on the chalcogenide side) that makes electrical contact between chalcogenide layer 232 and wordline 310. Insulative layer 238 and cap layer 240 are typically nitride layers that contour chalcogenide layer 232 and upper electrode 236 to define a chalcogenide active area and contact opening, respectively, as described above. Alternatively, chalcogenide layer 232 may be comprised of multiple layers, such as layers 32a, 32b, and 32c shown in the embodiment of FIG. 12. Chalcogenide, electrode, cap and insulative layer compositions suitable for use in this embodiment may include those previously mentioned for use in other embodiments.

In addition to providing large diode surface area for producing large current throughput as in the previously described embodiments, the embodiment of FIG. 18 offers additional space saving advantages on memory matrix 300. Because two memory cells 330 may share a single diode container 210, cells 330 may be disposed in closer proximity across the surface of memory matrix 330. Each memory cell 330 constructed according to the embodiment shown in FIG. 18 may be disposed in a plot averaging about 0.625×0.5 microns or less along its upper surface, giving an area of about 0.3125 microns$^2$, or a non-volatile density of about 1 Gbit using 0.25 micron photolithography. As a result, distance across the two memory cells 330 shown in FIG. 18, from the left field trench 250 to the right field trench 250, may typically be is short as about 1.25 microns or less. Width of a dual memory cell plot (in the direction into the paper) may typically be as short as 0.5 microns or less.

Figure 19:
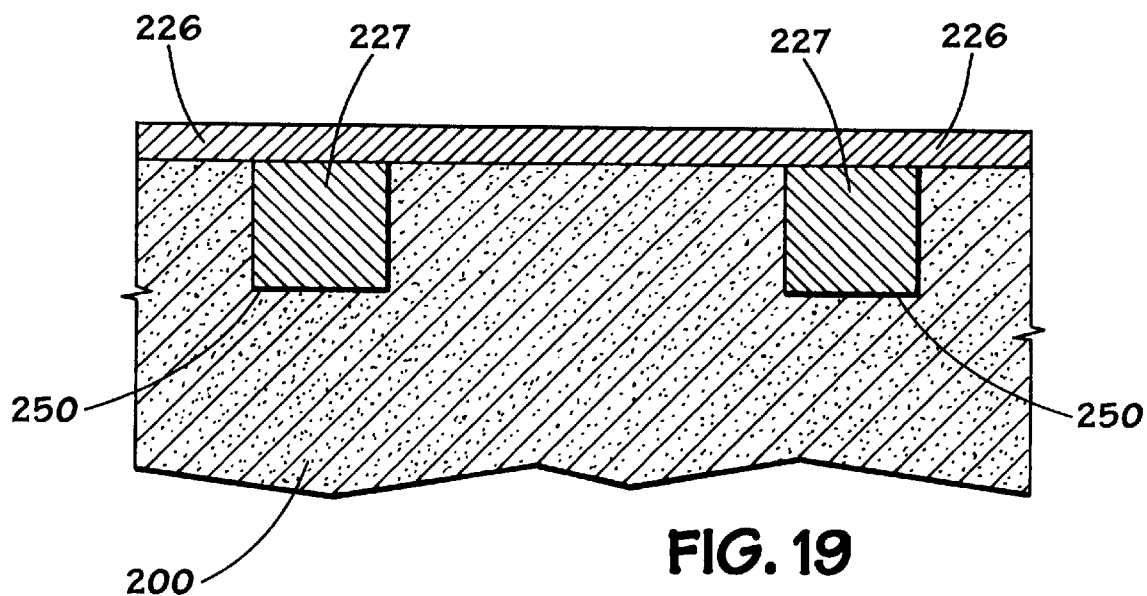
FIG. 19 is a cross-sectional view of an in-process memory cell according to the embodiment shown in FIG. 18, showing formation and oxidation of field trenches.

One embodiment of a method for forming a "trench" diode memory cell 330 as shown in FIG. 18 is now described in detail. With reference to FIG. 19, substrate 200, which is typically P type silicon, is shown. In this embodiment of the disclosed method, substrate 200 may be divided into active fields. A plurality of field trenches 250 may be formed in substrate 200. Field trenches 250 may be long parallel trenches disposed perpendicularly to the cross-section and running in a direction going into the paper. In this embodiment, field trenches 250 may be formed by depositing a pattern on substrate 200, then performing a silicon etch. A doping step, typically a boron implantation step, may be performed to define the field. Oxide layers 227 and 226 may be deposited so as to substantially fill trenches 250 and leave an oxide layer generally above substrate 200. Oxide may be planarized above trenches 250.

Figure 20:
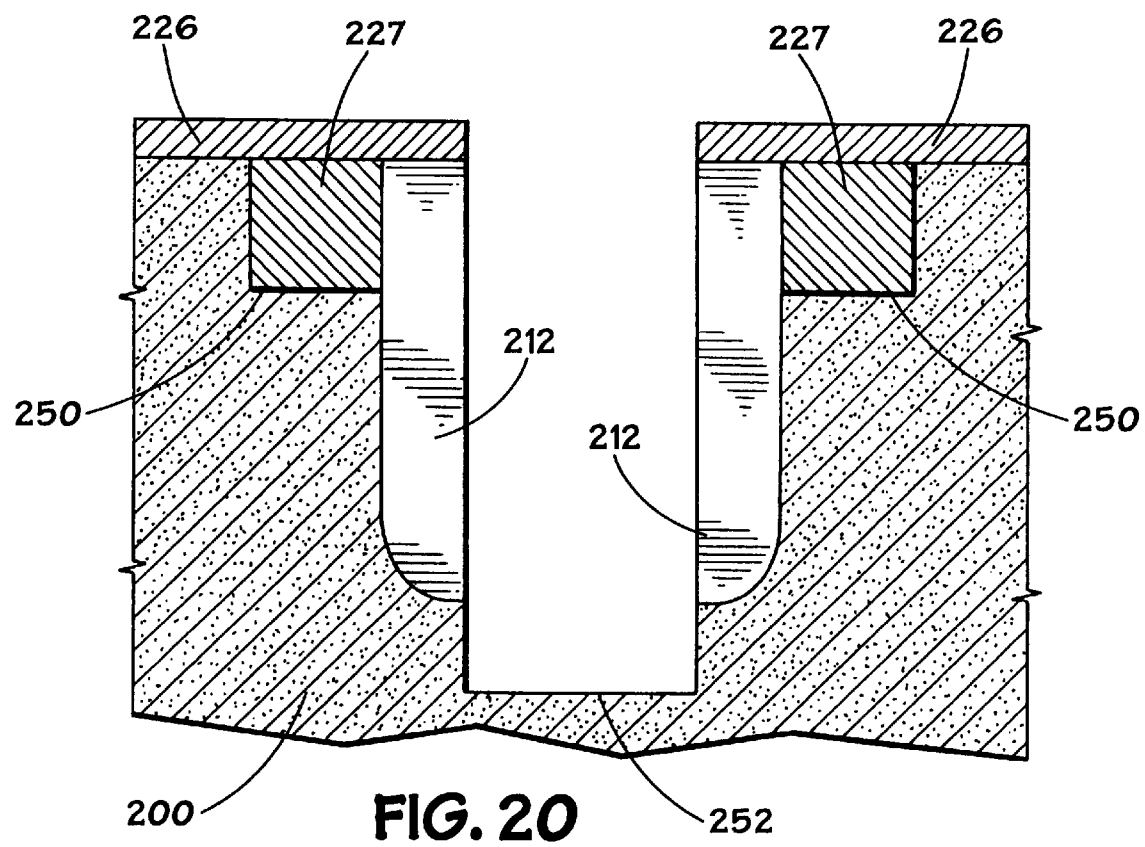
FIG. 20 is a cross-sectional view of an in-process memory cell according to the embodiment shown in FIG. 18, showing formation of the container trench and first diode layer.

FIG. 20 illustrates one embodiment for formation of container trench 252 and first diode layer 212 of the embodiment shown in FIG. 18. In this embodiment, container trench 252 may be a relatively long and deep trench recessed into substrate 200 and running substantially parallel to field trenches 250. Container trench 252 may be formed by depositing a pattern on oxide layer 227, and then performing a oxide/silicon etch. Container trench 252 is typically from 3 microns to about 10 microns deep and about 0.25 microns wide, and will deliver a drive of about 2 mA at about 2V with acceptable reverse bias leakage current. However, other dimensions may be chosen to provide desired current drive and operation of memory cell 330. The bottom of container trench 252 may also be doped, typically by implanting boron. In this embodiment, first diode layer 212 may be formed along or proximate to side walls of container trench 252, and may extend substantially the entire length of container trench 252. First diode layer 212 is typically formed by angularly implanting N- phosphorus ions using only two angles, 180 degrees apart, although other methods of implantation may be used successfully. When implantation angles are limited to two angles 180 degrees apart, substantially no implantation occurs at bottom of container trench 252. In addition, substantially no implantation occurs on edges of memory matrix 300, helping to ensure that container trenches 252 and field trenches 250 are not shorted together.

Figure 21:
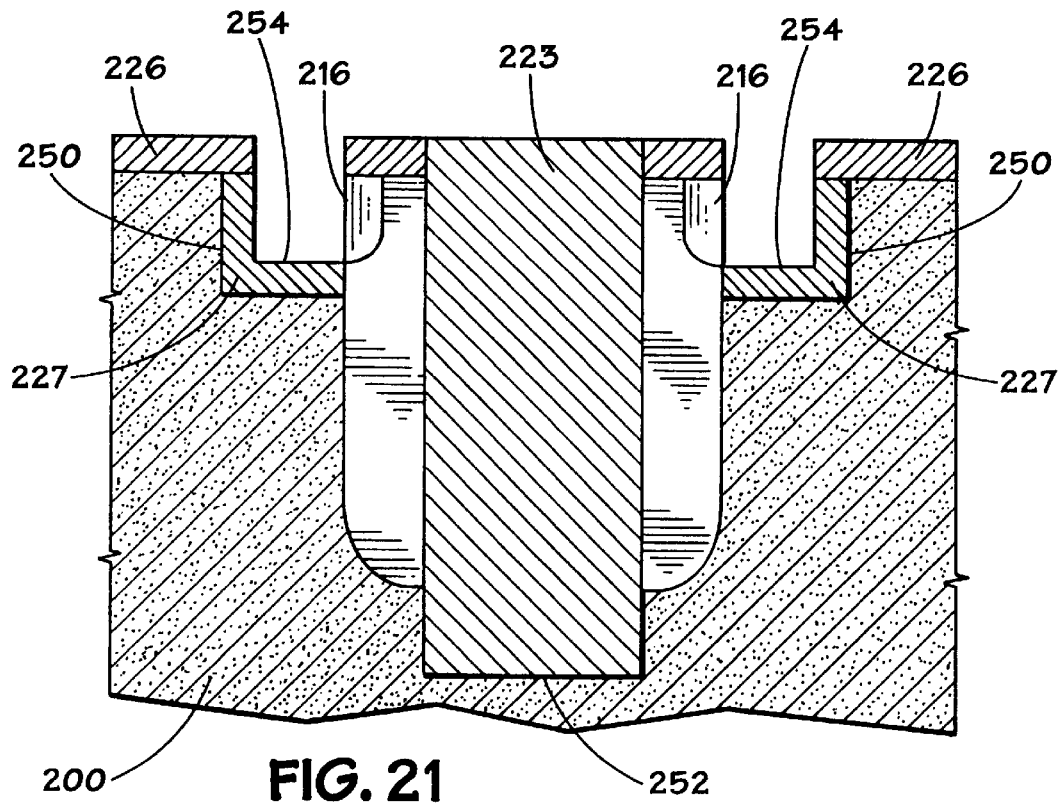
FIG. 21 is a cross-sectional view of an in-process memory cell according to the embodiment shown in FIG. 18, showing oxidation of the container trench and formation of the digitline trenches.

FIG. 21 illustrates one embodiment for filling of container trench 252 for the embodiment of FIG. 18. In this embodiment, container trench 252 may be filled with oxide 223 substantially along its entire length. This oxide may be planarized above container trench 252. Oxide layers 226 and 227, disposed in and above field trenches 250, may be patterned and etched to create digitline trenches 254, which may run substantially along the entire length of field trenches 250. Advantageously, in this embodiment, two parallel digitlines may coexist in the same trench isolation region as long as they are isolated, such as by oxide. Layer 216 may be formed on side of digitline trench 254, typically by angular implantation of N+ type material. Again, only two implant angles are typically used to avoid shorting together digitline trenches 254 at end of matrix 300.

Figure 22:
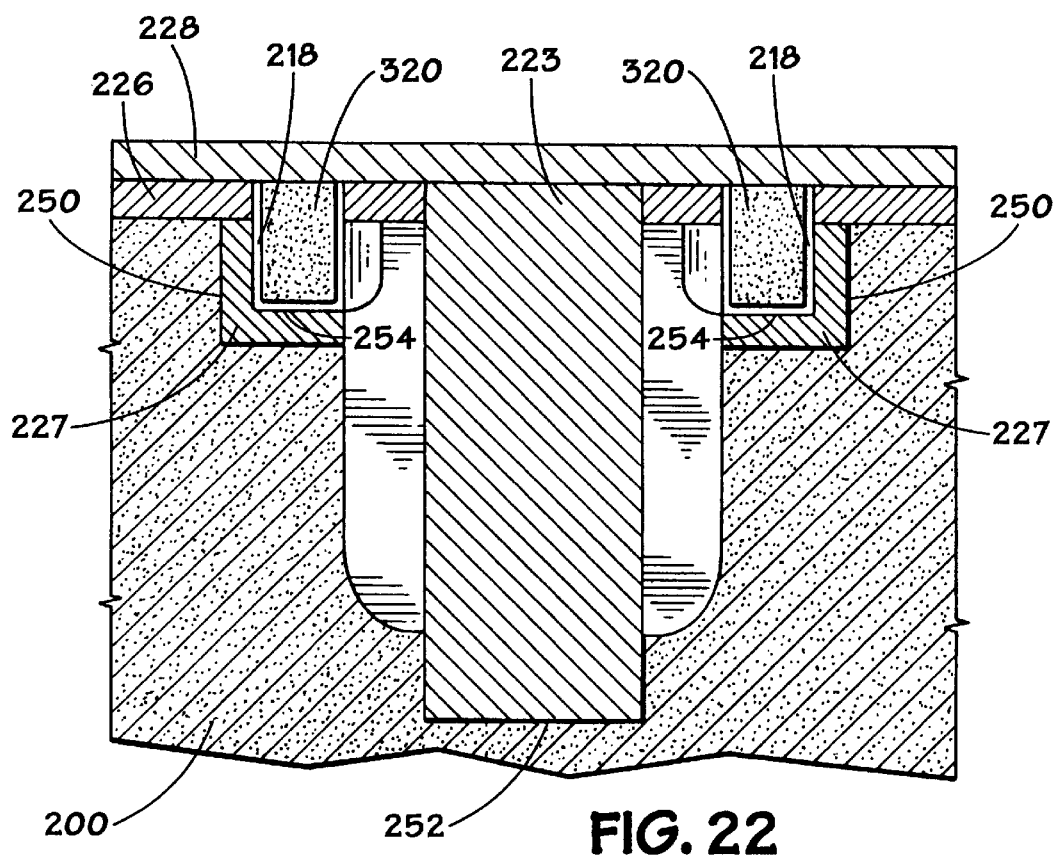
FIG. 22 is a cross-sectional view of an in-process memory cell according to the embodiment shown in FIG. 18, showing formation of digitlines.

FIG. 22 illustrates one embodiment for formation of digitline 320 in digitline trench 254. First, a digitline liner layer 218 is typically deposited on or along inner surface of digitline trench 254 to strap digitline 320. In this embodiment, digitline 320 is typically tungsten, digitline liner layer 218 is typically Ti Si$_2$, and deposition of digitline layer 218 is typically followed by an RTP annealing step at about 650° C. for about 10 seconds. However, digitline 320 may be any suitable conducting material, such as TiW. Likewise, digitline liner layer 218 may also be other suitable conductive materials including, but not limited to, titanium nitride, titanium silicide, cobalt silicide and tantalum silicide. An oxide layer 228 may be deposited to isolate the newly formed digitline 320.

Figure 23:
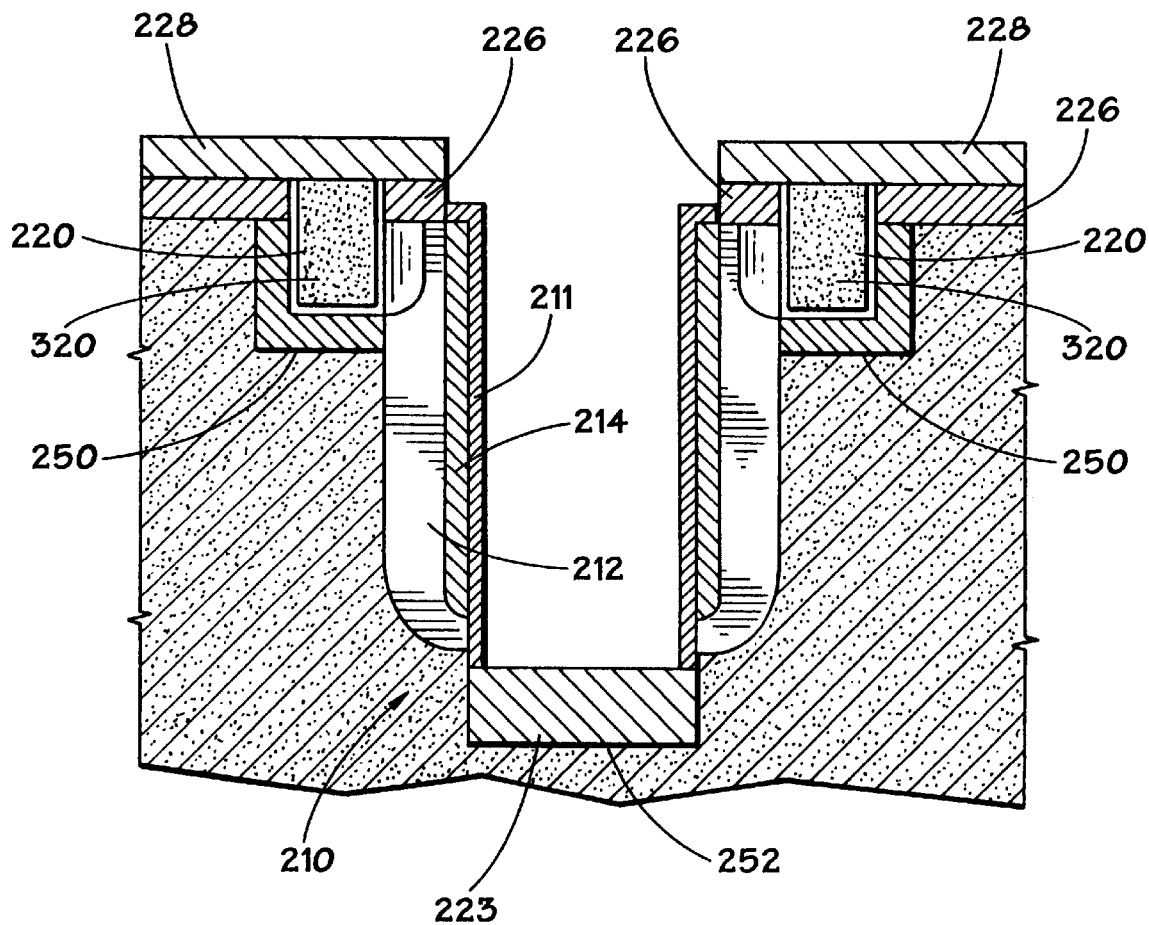
FIG. 23 is a cross-sectional view of an in-process memory cell according to the embodiment shown in FIG. 18, showing formation of the diode container and the second diode layer disposed therein to form two diodes.

FIG. 23 illustrates one embodiment for the creation of container 210 in container trench 252. Oxide layer 223 may be selectively removed from trench 252 to define a plurality of containers 210 which may run along the length of trench 252. This is typically accomplished by patterning oxide layer 228 on its upper surface and performing an oxide etch. In this embodiment, an etch pattern typically defines a plurality of square (from above) containers 210 disposed along the length of trench 252, with thin oxide spacers being left unetched to provide isolation between neighboring containers 210. A thin layer 223 of oxide typically remains unetched at the bottom of each container 210. Typically that this etching step be isotropic so that substantially all oxide may be removed from side walls of container 210 where a diode is to be formed. This etching step is also typically highly selective to silicon. In the practice of this embodiment, portions of oxide layer 228 disposed over digitline 320 and portions of layer 226 lying between digitline 320 and the top of container 210 are typically preserved in order to isolate digitline 320 from diode contact 220. However, oxide etching may have a tendency to eat these portions away. Accordingly, layer 228 may alternatively be formed of nitride, nitride-oxide, or other insulates in order to avoid unintended etching during container definition.

Continuing to refer to the embodiment illustrated in FIG. 23, second diode layer 214 may be formed in side walls of each container 210 so as to define a diode. Second diode layer 214 is typically a P+ type material formed by angularly implanting BF$_2$ at low energy. A TiSi$_2$ lining 211 is typically deposited to form a strap on the P+ side and RTP sintering and annealing steps performed. Both sintering and annealing steps may be followed by low temperature processing in a bath of sulfuric acid and hydrogen peroxide (known as "piranha" processing) in order to remove, for example, residual titanium nitride. Referring now to FIG. 18, container 210 is typically filled with oxide to simultaneously create layers 230 and 222, and a planarization step performed. Openings for diode contact 220 may be patterned and etched so as to dispose diode contact 220 in communication with second diode layer 214. A lining 221, typically of TiSi$_2$, is typically deposited, followed by a RTP step. Diode contact 220, typically tungsten, may be deposited in the lined hole to complete fabrication of a diode. Thus, first diode layer 212 may be effectively strapped with tungsten, with deeper diode contacts allowing for greater strapping. Advantageously, this feature may be used to create a diode that is strapped on both sides. In this embodiment, diode contact 220 may spill over the neighboring oxide layers.

Referring now to FIG. 18, memory element portions of each cell may be disposed above or proximate to layer 230 and may be formed in manners and with materials similar to those described in the embodiments presented above. For example, lower electrode 234 may be formed by depositing a dual conductor-carbon layer on top of layer 230 and in electrical contact with diode contact 220. Suitable conductive materials for lower electrode 234 may include highly conductive materials such as TiW or Ti, typically TiW. Insulative layer 238 is formed typically by deposition and selective etching of a nitride layer to define an opening near the center of memory cell 330 through which chalcogenide layer 232 may come into contact with lower electrode 234. Chalcogenide layer 232 may be deposited, in a conventional manner or other suitable method known to the art, so that layer 232 may come into contact with lower electrode 234 in the pore opening defined by insulative layer 238. This may define a chalcogenide active area which is typically from about 0.25 microns to about 0.5 microns across, most typically about 0.3 microns across. Cap layer 240 may be formed, typically by depositing a nitride layer on top of chalcogenide layer 232 and selectively etching the nitride layer to define a contact opening directly above or proximate to the chalcogenide active area, so as to dispose upper electrode 236 in electrical communication with chalcogenide layer 232. Upper electrode 236 may be formed by depositing a dual carbon-conductor layer so that it comes into contact with chalcogenide layer 232 in the pore opening defined by cap layer 236. Alternatively, a layer of carbon may be deposited on top of chalcogenide layer 232 prior to deposition of cap layer 240, and without deposition of upper electrode 236. Finally, wordline 310 may be formed so that it is in electrical contact with upper electrode 236 or, when upper electrode 236 is not present, with the carbon layer deposited on top of chalcogenide layer 232. Wordline 310 may be formed by deposition and selective etching of a metal layer or any other suitable conducting material know to the at, typically aluminum.

Although particular exemplary materials and methods have been detailed for each of the "stack/trench", "stack", and "trench" embodiments; illustrated and described above, it is possible to obtain benefits of the disclosed method by utilizing combinations of these materials and methods in the form of embodiments not otherwise described above. In addition, while the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims.

What is claimed is:

1. A multi-state material-based memory cell having a first node and a second node, said cell comprising:
    a container layer comprising a substrate layer;
    a diode container extending downwardly into said container layer, said first node being disposed in electrical communication with at least a portion of a perimeter of said container;
    a diode disposed inside said container said diode comprising a first diode layer disposed in said substrate layer proximate at least a portion of said perimeter of said container, and a second diode layer disposed inside said first diode layer; and
    a multi-state memory element electrically coupled between said diode and said second node of said memory cell.

2. The memory cell of claim 1, wherein said multi-state material is a chalcogenide.

3. A multi-state material-based memory matrix formed on a structure having a substrate layer, said matrix comprising:
    a plurality of memory cells disposed between a plurality of first address lines and second address lines, each said memory cell comprising:
        (i) a first node and a second node, said first node being electrically connected to one of said first address lines and said second node being electrically connected to one of said second address lines;
        (ii) a multi-state material memory element electrically coupled to said second node; and
        (iii) a diode disposed in a container extending from a top surface of said substrate layer downwardly into said substrate layer, said diode being electrically coupled between said memory element and said first node, said diode comprising a first diode layer disposed in said substrate layer proximate at least a portion of said perimeter of said container, and a second diode layer disposed inside said first diode layer.

4. The memory matrix of claim 3, wherein the multi-state material is a chalcogenide.

5. A multi-state material-based memory cell having a first node and a second node, said cell comprising:
    a substrate;
    an oxide layer disposed above said substrate;
    a diode container extending downwardly into said oxide layer, said first node being disposed in electrical communication with a perimeter of said container;
    a diode disposed inside said container;
    a multi-state material memory element electrically coupled between said diode and said second node of said memory cell; and
    a container lining disposed proximate at least a portion of said perimeter of said container between said perimeter and said diode, said lining effective to reduce resistance in said diode during operation of said cell.

6. The memory cell of claim 5, wherein said multi-state material is a chalcogenide.

7. The memory cell of claim 6, wherein said diode container extends downwardly from a top surface of said oxide layer.

8. The memory cell of claim 6, wherein said first node is disposed in said substrate proximate to at least a portion of a bottom side of said perimeter of said diode container.

9. The memory cell of claim 6, wherein said diode comprises a first diode layer juxtaposed proximate to at least a portion of said perimeter of said container, and a second diode layer disposed concentrically inside said first diode layer.

10. The memory cell of claim 9, wherein said first diode layer is a layer of doped amorphous silicon.

11. The memory cell of claim 10, wherein said second diode layer is a layer of silicon formed by ion implantation of said first diode layer.

12. The method of claim 11, wherein said first diode layer is an N- material and said second diode layer is a P+ material.

13. The memory cell of claim 10, wherein said second diode layer is a layer of metal, said first diode layer and said second diode layer comprising a Schottky diode.

14. The memory cell of claim 6, wherein said memory element comprises a chalcogenide layer disposed between a lower electrode layer and an upper electrode layer.

15. The memory cell of claim 14, wherein said lower and upper electrode layers each comprise a layer of metal and a layer of carbon, said carbon layer disposed between the metal layer and the chalcogenide layer.

16. A multi-state material-based memory matrix formed on a structure having an oxide layer disposed above a substrate, said matrix comprising:
    a plurality of memory cells disposed between a plurality of first address lines and second address lines, each said memory cell comprising:
        (i) a first node and a second node, said first node being disposed on a upper surface of said substrate and electrically connected to one of said first address lines and said second node being electrically connected to one of said second address lines;
        (ii) a multi-state material memory element electrically coupled to said second node;
        (iii) a diode disposed in a container extending from a top surface of said oxide layer downwardly into said oxide layer, said container having a perimeter, and said diode being electrically coupled between said memory element and said first node and
        (iv) a strapping layer disposed in electrical contact with said one first address line across its entire length.

17. The memory matrix of claim 16, wherein the multi-state material is a chalcogenide.

18. The memory matrix of claim 17, wherein said first node of each said memory cell is in communication with said container so as to create an electrical contact between said first node and said diode.

19. The memory matrix of claim 18, wherein said diode of each said memory cell comprises a first diode layer juxtaposed proximate to at least a portion of said perimeter of said container, and a second diode layer disposed concentrically inside said first diode layer.

20. The memory matrix of claim 19, wherein said first diode layer is a layer of N type silicon.

21. The memory matrix of claim 20, wherein said second diode layer is a layer of P type silicon.

22. The memory matrix of claim 20, wherein said second diode layer is a layer of metal, said first diode layer and second diode layer comprising a Schottky diode.

23. The memory matrix of claim 18, wherein said substrate is p-type silicon.

24. The memory matrix of claim 18, wherein said first address line is a digitline and said second address line is a wordline.

25. The memory matrix of claim 18, wherein each said first node is a part of one of said first address lines.

26. The memory matrix of claim 16, wherein said strapping layer is a TiSi$_2$ layer.

27. A diode for a microelectronic circuit comprising:
    a container formed in a substrate, said container having a side;
    a first diode region disposed along said side of said container; and
    a second diode region disposed adjacent said first diode region.

28. The diode, as set forth in claim 27, wherein one of said first diode region and said second diode region comprises n doped silicon and the other of said first diode region and said second diode region comprises p doped silicon.

29. The diode, as set forth in claim 27, wherein said first diode region and said second diode region are disposed within said container.

30. The diode, as set forth in claim 27, wherein said first diode region and said second diode region are disposed in said substrate.

31. The diode, as set forth in claim 27, wherein said first diode region comprises:
    a first layer of doped silicon disposed on said side of said container.

32. The diode, as set forth in claim 31, wherein said second diode region comprises:
    a second layer of doped silicon disposed on said first layer of silicon.

33. The diode, as set forth in claim 27, wherein said first diode region comprises a layer of doped silicon disposed on said side of said container, and wherein said second diode region comprises an oppositely doped region of said layer of doped silicon.

34. A diode for a microelectronic circuit comprising:
    a container formed in a substrate, said container having at least two sides;
    a first diode region formed along at least one of said at least two sides; and
    a second diode region formed along said first diode region.

35. The diode, as set forth in claim 34, wherein one of said first diode region and said second diode region comprises n doped silicon and the other of said first diode region and said second diode region comprises p doped silicon.

36. The diode, as set forth in claim 34, wherein said first diode region and said second diode region are disposed within said container.

37. The diode, as set forth in claim 34, wherein said first diode region and said second diode region are disposed in said substrate.

38. The diode, as set forth in claim 34, wherein said first diode region comprises:
    a first layer of doped silicon disposed on said at least one side of said container.

39. The diode, as set forth in claim 38, wherein said second diode region comprises:
    a second layer of doped silicon disposed on said first layer of silicon.

40. The diode, as set forth in claim 34, wherein said first diode region comprises a layer of doped silicon disposed on said at least one side of said container, and wherein said second diode region comprises an oppositely doped region of said layer of doped silicon.

41. The diode, as set forth in claim 34, wherein said container further comprises a bottom, said first diode region being disposed along said two sides and said bottom of said container.

42. A memory cell comprising:
    a container formed in a substrate, said container having a side;
    a first diode region disposed along said side of said container;
    a second diode region disposed adjacent said first diode region; and
    a memory element coupled to one of said first diode region and said second diode region.

43. The memory cell, as set forth in claim 42, wherein one of said first diode region and said second diode region comprises n doped silicon and the other of said first diode region and said second diode region comprises p doped silicon.

44. The memory cell, as set forth in claim 42, wherein said first diode region and said second diode region are disposed within said container.

45. The memory cell, as set forth in claim 42, wherein said first diode region and said second diode region are disposed in said substrate.

46. The memory cell, as set forth in claim 42, wherein said first diode region comprises:
    a first layer of doped silicon disposed on said side of said container.

47. The memory cell, as set forth in claim 46, wherein said second diode region comprises:
    a second layer of doped silicon disposed on said first layer of silicon.

48. The memory cell, as set forth in claim 42, wherein said first diode region comprises a layer of doped silicon disposed on said side of said (container, and wherein said second diode region comprises an oppositely doped region of said layer of doped silicon.

49. The memory cell, as set forth in claim 42, wherein memory element comprises a chalcogenide member.

50. A memory cell comprising:
    a container formed in a substrate, said container having at least two sides;
    a first diode region formed along at least one of said at least two sides;
    a second diode region formed along said first diode region; and
    a memory element coupled to one of said first diode region and said second diode region.

51. The memory cell, as set forth in claim 50, wherein one of said first diode region and said second diode region comprises n doped silicon and the other of said first diode region and said second diode region comprises p doped silicon.

52. The memory cell, as set forth in claim 50, wherein said first diode region and said second diode region are disposed within said container.

53. The memory cell, as set forth in claim 50, wherein said first diode region and said second diode region are disposed in said substrate.

54. The memory cell, as set forth in claim 50, wherein said first diode region comprises:

a first layer of doped silicon disposed on said at least one side of said container.

55. The memory cell, as set forth in claim 54, wherein said second diode region comprises:

a second layer of doped silicon disposed on said first layer of silicon.

56. The memory cell, as set forth in claim 50, wherein said first diode region comprises a layer of doped silicon disposed on said at least one side of said container, and wherein said second diode region comprises an oppositely doped region of said layer of doped silicon.

57. The memory cell, as set forth in claim 50, wherein said container further comprises a bottom, said first diode region being disposed along said two sides and said bottom of said container.

58. The memory cell, as set forth in claim 50, wherein said memory element comprises a chalcogenide member.

59. A multi-state material-based memory cell disposed on a substrate, said memory cell having a first node and a second node, said cell comprising:

a container having a side extending from a top surface of said substrate downwardly into said substrate;

a diode formed in a region of said substrate proximate to said container side, said diode being disposed between said first node and said side of said container;

a multi-state memory material element electrically coupled between said diode and said second node of said memory cell; and a container lining disposed proximate to at least a portion of said side of said container, said lining being effective to reduce resistance experienced by said diode during operation of said cell.

60. A multi-state material-based memory cell disposed on a substrate, said memory cell having a first node and a second node, said cell comprising:

a container having a side extending from a top surface of said substrate downwardly into said substrate;

a diode formed in a region of said substrate proximate to said container side, said diode being disposed between said first node and said side of said container; and a multi-state memory material element electrically coupled between said diode and said second node of said memory cell;

wherein said memory cell is disposed between a first address line and a second address line, said first node being electrically connected to said first address line and said second node being electrically connected to said second address line, said diode being electrically coupled between said memory element and said first node, and wherein said first address line and said first node of said memory cell are disposed in a surface of said substrate, said first node being part of said first address line.

* * * * *

United States Patent and Trademark Office
CERTIFICATE OF CORRECTION

PATENT NO : 6,118,135

DATED : September 12, 2000

INVENTOR(S) : Fernando Gonzalez et al.

It is certified that error appears in the above-identified patent and that said Letters Patent are hereby corrected as shown below:

On the front page, in the section entitled "Related U.S. Application Data," delete the entire claim of priority and replace with the following:

-- This application is a continuation of application serial number 08/681,278, filed July 22, 1996, now U.S. Patent 5,831,276; which is a continuation-in-part of application serial number 08/483,760, filed June 7, 1995, abandoned in favor of application serial number 08/799,515, filed February 12, 1997, now U.S. Patent 5,841,150.--

Signed and Sealed this

Twenty-fourth Day of April, 2001

Attest:

NICHOLAS P. GODICI

Attesting Officer

Acting Director of the United States Patent and Trademark Office